(12) United States Patent
Ogihara et al.

(10) Patent No.: US 8,603,732 B2
(45) Date of Patent: Dec. 10, 2013

(54) RESIST UNDERLAYER FILM-FORMING COMPOSITION, PROCESS FOR FORMING RESIST UNDERLAYER FILM AND PATTERNING PROCESS

(75) Inventors: Tsutomu Ogihara, Jyoetsu (JP); Takeru Watanabe, Jyoetsu (JP); Takeshi Kinsho, Jyoetsu (JP); Katsuya Takemura, Jyoetsu (JP); Toshihiko Fujii, Jyoetsu (JP); Daisuke Kori, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 213 days.

(21) Appl. No.: 12/978,978

(22) Filed: Dec. 27, 2010

(65) Prior Publication Data

US 2011/0177459 A1   Jul. 21, 2011

(30) Foreign Application Priority Data

Jan. 19, 2010   (JP) .................. 2010-009412

(51) Int. Cl.
| | |
|---|---|
| G03F 7/09 | (2006.01) |
| G03F 7/11 | (2006.01) |
| G03F 7/20 | (2006.01) |
| G03F 7/30 | (2006.01) |
| G03F 7/36 | (2006.01) |

(52) U.S. Cl.
USPC ............ 430/311; 430/270.1; 430/271.1; 430/272.1; 430/312; 430/313; 430/316; 430/317; 430/318; 430/323; 430/325; 430/326; 430/905

(58) Field of Classification Search
None
See application file for complete search history.

(56) References Cited

U.S. PATENT DOCUMENTS

2002/0106909 A1   8/2002   Kato et al.
2005/0255712 A1   11/2005   Kato et al.

(Continued)

FOREIGN PATENT DOCUMENTS

| JP | A-06-061138 | 3/1994 |
|---|---|---|
| JP | A-2002-334869 | 11/2002 |

(Continued)

OTHER PUBLICATIONS

Derwent English abstract for JP2006-227391 (2006).*

(Continued)

*Primary Examiner* — Sin Lee
(74) *Attorney, Agent, or Firm* — Oliff & Berridge, PLC

(57) ABSTRACT

There is disclosed a resist underlayer film-forming composition comprising, at least: a resin (A) obtained by condensing a compound represented by the following general formula (1) with a compound represented by the following general formula (2) by the aid of an acid catalyst; a compound (B) represented by the general formula (1); a fullerene compound (C); and an organic solvent. There can be a resist underlayer film composition in a multi-layer resist film to be used in lithography, which underlayer film is excellent in property for filling up a height difference of a substrate, possesses a solvent resistance, and is not only capable of preventing occurrence of twisting during etching of a substrate, but also capable of providing an excellently decreased pattern roughness; a process for forming a resist underlayer film by using the composition; and a patterning process.

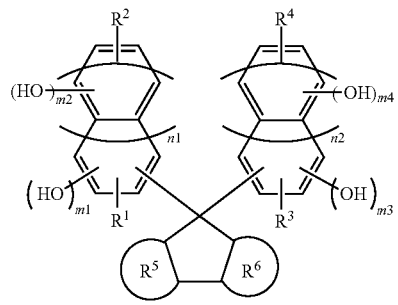

34 Claims, 1 Drawing Sheet

(56) References Cited

U.S. PATENT DOCUMENTS

2008/0118860 A1   5/2008   Harada et al.
2010/0081082 A1   4/2010   Yoshimura et al.
2010/0099044 A1*  4/2010   Hatakeyama et al. ..... 430/285.1

FOREIGN PATENT DOCUMENTS

| JP | A-2004-205685 | 7/2004 |
| JP | A-2004-264710 | 9/2004 |
| JP | A-2006-227391 | 8/2006 |
| JP | A-2007-199653 | 8/2007 |
| JP | A-2008-065081 | 3/2008 |
| JP | A-2008-111103 | 5/2008 |
| WO | WO 2004/066377 A1 | 8/2004 |
| WO | WO 2008/062888 A1 | 5/2008 |

OTHER PUBLICATIONS

Apr. 10, 2012 Office Action issued in Japanese Patent Application No. 2010-009412 (with partial translation).
Hirsch et al., "Globe-trotting Hydrogens on the Surface of the Fullerene Compound $C_{60}H_6(N(CH_2CH_2)_2O)_6$," *Angew. Chem. Int. Ed. Engl.*, 1991, vol. 30, No. 10, pp. 1309-1310.
Kampe et al., "Diamino and Tetraamino Derivatives of Buckminsterfullerene $C_{60}$," *Angew. Chem. Int. Ed. Engl.*, 1993, vol. 32, No. 8, pp. 1174-1176.
Hirsch et al., "Synthesis of Isomerically Pure Organodihydrofullerenes," *Chem. Ber.*, 1993, vol, 126, pp. 1061-1067.
Skiebe et al., "[DBU]$C_{60}$. Spin pairing in a fullerene salt," *Chemical Physics Letters*, 1994, vol. 220, pp. 138-140.
Diederich et al., "Syntheses, Structures, and Properties of Methanofullerenes," *Chemical Society Reviews*, 1994, pp. 243-255.
"Chemistry of fullerene, the third allotrope of carbon," 1999, edited by Chemical Society of Japan and published by Society Publishing Center.
Sawamura et al., "The First Pentahaptofullerene Metal Complexes," *American Chemical Society*, 1996, vol. 118, No, 50, pp. 12850-12851.
Schick et al., "Reaction of [60]Fullerene with Morpholine and Piperidine: Preferred 1,4-Additions and Fullerene Dimer Formation," *J. Chem. Soc., Chem. Commun.*, 1995, pp. 2023-2024.
Sakai et al., "Sub-SSnm Etch Process Using Stacked-Mask Process," *Japanese Journal of Applied Physics*, 2007, vol. 46, No. 7A, pp. 4286-4288.
Seino et al., "Sub-45nm Resist Process Using Stacked-Mask Process," *Proc. of SPIE*, 2008, vol. 6923, pp. 69232O-1-69232O-8.
Abe et al., "Sub-55-nm Etch Process Using Stacked-Mask Process," *Dry Process International Symposium*, 2005, pp. 11-12.
Zhang et al., "1,3-Dipolar Cycloaddition of *N*-Benzyl Azomethine Ylide to $C_{60}$: Formation of a $C_{60}$-fused *N*-Benzylpyrrolidine," *Tetrahedron Letters*, 1993, vol. 51, pp. 8187-8188.
Li et al., "Convenient Synthesis of 6,5 Open and 6,6 Closed Cycloalkylidenefullerenes," *Tetrahedron Letters*, 1996, vol, 37, No. 27, pp. 4651-4654.
Prato et al., "Synthesis and Electrochemical Properties of Substituted Fulleropyrrolidines," *Tetrahedron*, 1996, vol. 52, No. 14, pp. 5221-5234.

* cited by examiner

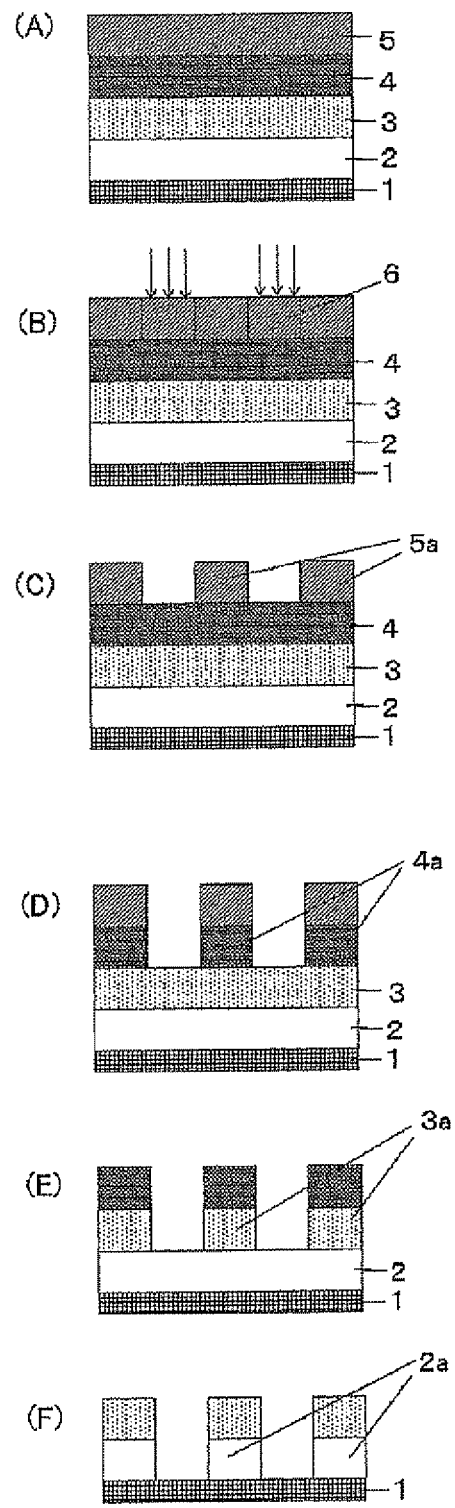

RESIST UNDERLAYER FILM-FORMING COMPOSITION, PROCESS FOR FORMING RESIST UNDERLAYER FILM AND PATTERNING PROCESS

BACKGROUND OF THE INVENTION

1. Field of the Invention

The present invention relates to a composition for a resist underlayer film useful for a multi-layer resist process used in microfabrication in manufacturing of a semiconductor device and the like, to a process for forming a resist underlayer film using this, and to a patterning process using this, suitable for exposure by a far ultraviolet, a KrF excimer laser beam (248 nm), an ArF excimer laser beam (193 nm), an $F_2$ laser beam (157 nm), a $Kr_2$ laser beam (146 nm), an $Ar_2$ laser beam (126 nm), a soft X-ray (EUV (Extreme Ultra Violet)), 13.5 nm), an electron beam (EB), and an X-ray, and the like.

2. Description of the Related Art

With highly integrated LSI's providing highly increased speeds, finer pattern rules are being rapidly promoted. Commensurately with the fineness, a lithography technique has attained formation of fine patterns, by virtue of light sources of shorter wavelengths and resist compositions appropriately selected therefor. The main role thereof was played by positive photoresist compositions to be each used as a monolayer. The monolayer positive photoresist composition is configured to possess, in a resist resin, a structure having an etching resistance against dry etching by chlorine-based or fluorine-based gas plasma, and to possess such a resist mechanism that an exposed portion is made dissolvable, so that the exposed portion is dissolved to thereby form a pattern, and the remaining resist pattern is used as an etching mask to dry etch a substrate to be processed coated with the resist composition.

However, when a pattern is made finer, i.e., pattern rules are further narrowed while keeping a thickness of a used photoresist film as it is, the photoresist film is deteriorated in resolution performance. Further, when the photo resist film is to be developed by a developer to form a pattern, a so-called aspect ratio thereof is made excessively large, thereby resultingly causing a pattern collapse. Accompanying the trend toward finer-pattern, the film thickness of a photoresist film has been made thinner.

Meanwhile, although for processing of a substrate to be processed, there is typically used a method for processing the substrate by dry etching by adopting a patterned photoresist film as an etching mask, practically no dry etching methods exist to exhibit a complete etching selectivity between a photoresist film and a substrate to be processed, so that the resist film is also damaged during processing of the substrate and the resist film is collapsed during processing of the substrate, thereby failing to accurately transfer a resist pattern onto the substrate to be processed. Thus, with finer patterns, resist compositions have been required to have higher dry etching resistances.

Further, since shortened wavelengths of exposure have demanded that resins having lower light absorption at exposure wavelengths are used for resist compositions, such resins have been subjected to a transitional history from a novolak resin, through polyhydroxystyrene, and to a resin having an aliphatic polycyclic frame, commensurately with a transitional history from i-line, through KrF, and to ArF. However, etching speeds under the dry etching condition have been practically made higher, so that recent photoresist compositions having higher resolutions practically tend to be rather lowered in etching resistance.

This obliges a substrate to be processed to be dry etched by a photoresist film which is inevitably thinner and weaker in etching resistance, thereby making it urgent to ensure a material and a process in this processing state.

As one of the methods for solving such problems, a multi-layer resist process is available. In this method, a intermediate layer film whose etching selectivity is different from that of the photoresist film, i.e., a resist upper layer film is disposed between the resist upper layer film and the substrate to be processed, the pattern is obtained in the resist upper layer film, subsequently the pattern is transferred onto the resist intermediate layer film by dry etching using the resist upper layer pattern as the dry etching mask, and further the pattern is transferred onto the substrate to be processed by the dry etching using the intermediate film pattern as the dry etching mask.

In a two-layer resist process which is one of the multilayer resist processes, for example, silicon-containing resin is used for the resist upper layer composition, and organic resin which has high carbon-containing volume, such as the novolak resin is used as the resist underlayer film. The silicon-containing resin exhibits the good etching resistance to the reactive dry etching with oxygen plasma, but is easily removed by the etching when fluorine-based gas plasma is used. Meanwhile, the novolak resin is easily removed by the etching in the reactive dry etching with the oxygen plasma, but exhibits the good etching resistance to the dry etching with the fluorine-based gas plasma and the chloride-based gas plasma. Thus, a novolak resin film is formed as the resist underlayer film on the substrate to be processed, and a resist upper layer film using the silicon-containing resin is formed thereon. Subsequently, the pattern is formed in the silicon-containing resist film by post treatments such as exposure to energy beam and development. Using this as the dry etching mask, the portion of the novolak resin where the resist pattern has been removed is removed by the reactive dry etching with the oxygen plasma to transfer the pattern in the novolak film. Using this pattern transferred to the novolak resin as the dry etching mask, the pattern can be transferred to the substrate to be processed using the etching with the fluorine-based gas plasma or the chloride-based gas plasma.

In such a pattern transfer by the dry etching, when the etching resistance of the etching mask is sufficient, the transferred pattern having a relatively good shape is obtained. Thus, a problem of a pattern collapse caused by friction and the like by a developer upon resist development hardly occurs, and the pattern having a relatively high aspect ratio can be obtained. Therefore, for example, when the resist film using the novolak resin has the thickness corresponding to the film thickness of the intermediate film, even in the fine pattern which could not be formed directly because of the pattern collapse upon development due to the aspect ratio, according to the above two-layer resist process, the novolak resin pattern having the sufficient thickness as the dry etching mask for the substrate to be processed is obtained.

The multi-layer resist process further include a three-layer resist process which can be performed by using a typical resist composition used in a monolayered resist process. For example, this method is configured to form: an organic film as a resist under layer film based on novolak or the like on a substrate to be processed; a silicon-containing film as a resist intermediate film, thereon; and a typical organic photoresist film as a resist upper layer film, thereon. Since the organic resist upper layer film exhibits an excellent etching selectivity ratio relative to the silicon-containing resist intermediate film for dry etching by fluorine-based gas plasma, the resist pattern is transferred to the silicon-containing resist intermediate film by means of dry etching based on fluorine-based gas plasma. According to this method, as well as two-layer resist process, patterns of novolak films having sufficient dry etching resistances for processing can be obtained insofar as patterns can be transferred to silicon-containing films, even by adopting: a resist composition which is difficult to be formed with a pattern having a sufficient film thickness for direct processing of a substrate to be processed; and a resist composition having an insufficient dry etching resistance for processing of a substrate.

While numerous techniques have been known (such as Japanese Patent Laid-Open (kokai) No. 2004-205685 and the like) for the organic underlayer film as described above, decrease of processing line width has been accompanied by such a problem that phenomena of twisting, bending, and the like of a resist underlayer film are caused when the resist underlayer film is used as a mask for etching a substrate to be processed (Proc. of Symp. Dry. Process, (2005), p 11). Such twisting of a fine pattern is considered to be caused by a phenomenon having been reported to result in substitution of hydrogen atoms of a resist underlayer film with fluorine atoms during etching of a substrate by a fluorocarbon-based gas, to thereby exemplarily increase a volume of the underlayer film to swell it and to lower a glass transition point thereof (Proc. of SPIE Vol. 6923, 692320, (2008)). In turn, it has been reported that the problem of twisting can be prevented by adopting an organic material, which is low in hydrogen atom content ratio, as a resist underlayer film. In this respect, amorphous carbon films formed by CVD are each allowed to be extremely less in the number of hydrogen atoms in the film itself, and are extremely effective for prevention of twisting. However, CVD is unfortunately insufficient in characteristic to fill up a height difference, which is present on a substrate to be processed, and it is occasionally difficult to introduce a CVD apparatus due to its cost and an increased footprint occupation area of the apparatus. It will be thus able to obtain a remarkable merit of simplification of a process and an apparatus, if the above problem of twisting is solved based on a resist underlayer film composition which can be formed into a film by coating, particularly by spin coating.

As the above-described film-forming material which is low in hydrogen atom content ratio and which can be coated and formed into a film, films each containing a fullerene derivative have been proposed for prevention of twisting up to now, which fullerene derivative is extremely high in carbon ratio. For example, while a method for forming a film by fullerene itself has been proposed at a very early stage (Japanese Patent Laid-Open (kokai) No. H06-61138), there have been subsequently and exemplarily proposed another method to once disperse a fullerene derivative into an organic resin and to cure the dispersion (Japanese Patent Laid-Open (kokai) No. 2004-264710, Japanese Patent Laid-Open (kokai) No. 2006-227391), a further method to form a fullerene derivative into a film and to cure it (WO2008/62888A1), and the like.

However, fullerenes each exhibit absorption over a range from visible to near-infrared light, as a nature of the applicable fullerene itself. As such, in case of a coated film containing a fullerene and/or fullerene derivative at a high concentration, it is likely to lose sight of an alignment mark to be used for alignment upon exposure process, thereby deteriorating an alignment precision. Further, it is possible to prevent twisting of a pattern, when etching is conducted based on a underlayer film formed of a composition, so as to prevent this problem, comprising: a fullerene and/or fullerene derivative; and a resin which is conventionally known to be less in light absorption in above-mentioned wavelength range. However, even in such a case, those compositions which result in considerable surface roughness of completed patterns are not practical, due to accompanying problems such as an increased probability of disconnection of resultant wiring, deterioration of parasitic capacitance, and the like. As such, composition control at a molecular level is demanded for a resist underlayer film-forming composition for forming an ultra fine wiring having a line width of 40 nm or less.

SUMMARY OF THE INVENTION

The present invention has been carried out in view of the above circumstances, and it is therefore an object of the present invention to provide: a resist underlayer film composition in a multi-layered resist film to be used in a lithography, as a resist underlayer film-forming composition for forming a resist underlayer film, which underlayer film is excellent in property for filling up a height difference of a substrate, possesses a solvent resistance, and is not only capable of preventing occurrence of twisting of the underlayer film itself during etching of a substrate, but also capable of providing an excellently decreased pattern roughness after etching without affecting an alignment upon exposure; a process for forming a resist underlayer film by using the composition; and a patterning process.

To solve the above problem, the present invention provides a resist underlayer film-forming composition comprising, at least:

a resin (A) obtained by condensing a compound represented by the following general formula (1) with a compound represented by the following general formula (2) by the aid of an acid catalyst;

a compound (B) represented by the general formula (1);

a fullerene compound (C); and an organic solvent,

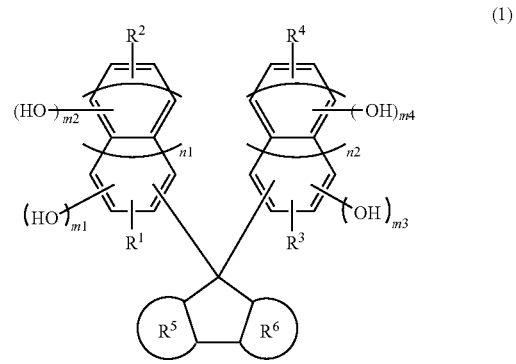

wherein, $R^1$, $R^2$, $R^3$, and $R^4$ are the same or different from one another, and are each a hydrogen atom, or a hydrocarbon group having 6 to 22 carbon atoms, which hydrocarbon group may contain an oxygen atom or a hydroxyl group;

$R^5$ and $R^6$ are each a benzene ring or a naphthalene ring;

$1 \leq m1+m2 \leq 2$;

$1 \leq m3+m4 \leq 2$; and n1 and n2 are each 0 or 1, $$R^7\text{—CHO} \qquad (2)$$

Wherein, $R^7$ is a hydrogen atom, a saturated or unsaturated linear, branched, or cyclic hydrocarbon group having 1 to 20 carbon atoms, or an aromatic hydrocarbon group having 6 to 20 carbon atoms, which hydrocarbon groups may contain an ether group, a nitro group, a hydroxyl group, or a chloro group.

In this way, according to the resist underlayer film-forming composition containing at least: the resin (A) obtained by condensing the compound represented by the above general formula (1) with the compound represented by the above general formula (2) by the aid of an acid catalyst; the compound (B) represented by the general formula (1); the fullerene compound (C); and the organic solvent; the resin (A) and the compound (B) are subjected to an oxidative coupling reaction therebetween to cure while causing dehydrogenation upon formation of the resist underlayer film, in addition to inclusion of the fullerene compound (C) which is effective for prevention of twisting after etching, thereby enabling to decrease the number of hydrogen atoms in the resist underlayer film by virtue of the oxidative coupling reaction, to allow for prevention of twisting of the resist underlayer film after etching. This further allows for obtainment of a fully cured resist underlayer film, so that the resist underlayer film is capable of exhibiting a resistance against a coating solution to be applied onto the thus formed underlayer film in the next step, thereby enabling to form the resist underlayer film which exhibits an excellent performance.

Further, the compound (B) acts as a curing agent and this curing agent (B) is a compound having a structure which is the same as or similar to that of a repeating unit in the resin (A), thereby enabling to avoid a non-homogeneity of a composition within the finished film, to thereby obtain a pattern which is less in pattern roughness. Further, such a resist underlayer film-forming composition of the present invention is capable of being coated and formed into a film, and the composition contains the compound (B) as a monomer component, so that the compound is excellent in filling-up characteristic.

In this way, the resist underlayer film formed from the resist underlayer film-forming composition of the present invention containing the resin (A), the compound (B), and the fullerene compound (C) is not only less in twisting after etching, but also less in roughness of the completed pattern, so that the resist underlayer film is particularly promising as a underlayer film for forming an ultra fine pattern having a line width of 40 nm or less.

Further, it is preferable that the compound represented by the general formula (1) is a compound where n1=n2=1, and it is particularly preferable that the compound represented by the general formula (1) is a compound represented by the following general formula (3).

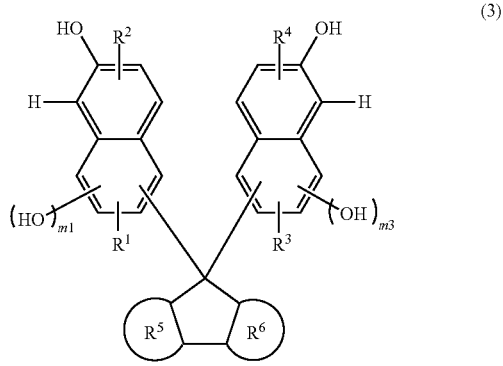

(3)

wherein,
$R^1$, $R^2$, $R^3$, $R^4$, $R^5$, and $R^6$ are the same meanings as before; and
m1 and m3 are each 0 or 1.

In case that the compound represented by the general formula (1) for obtaining the resin (A) of the resist underlayer film-forming composition of the present invention, or the compound (B) represented by the general formula (1) to be used as the curing agent, is the compound where n1=n2=1, and is particularly the compound represented by the general formula (3), the bisnaphthol structure of the compound has an etching resistance against a fluorocarbon-based gas, which resistance is substantially the same as that of the fullerene compound (C). This exhibits, not only such an effect to prevent twisting of a pattern of the resist underlayer film under an etching condition for etching a substrate to be processed which effect is provided by virtue of introduction of the fullerene compound, but also such an effect to restrict a deterioration of pattern roughness after etching to a minimal extent which deterioration is considered to be caused by a structural non-uniformity within the resist underlayer film upon etching, to thereby enable to obtain a substrate formed with an excellent pattern which is remarkably less in pattern roughness.

Furthermore, it is preferable that the compound represented by the general formula (2) is at least one kind of aldehyde compound selected from among formaldehyde, benzaldehyde, 1-naphthylaldehyde, and 2-naphthylaldehyde.

When at least one kind of aldehyde compound selected from among formaldehyde, benzaldehyde, 1-naphthylaldehyde, and 2-naphthylaldehyde is used as the compound represented by the general formula (2), the solubility of the compound represented by the general formula (1) in a solvent is made to be excellent, thereby enabling to prepare a resist underlayer film-forming composition without using a specific solvent.

Further, the present invention provides a process for forming a resist underlayer film to be used in a lithography, comprising at least the steps of:

spin coating the above-described resist underlayer film-forming composition of the present invention onto a substrate; and subsequently baking the substrate in an atmosphere of oxidizing gas at an oxidizing gas concentration between 0.1% or more and 21% or less. It is preferable that the oxidizing gas is oxygen.

When the resist underlayer film-forming composition of the present invention is baked in air, the resin (A) and the compound (B) are subjected to an oxidative coupling reaction therebetween to cure while causing dehydrogenation. Although this oxidative coupling reaction has been conventionally known as a method for producing a polymer by using a transition metal catalyst (see Japanese Patent Laid-Open (kokai) No. 2008-065081A, for example), no compounds have been known which are capable of curing based on this reaction upon formation of underlayer films.

When the resist underlayer film-forming composition of the present invention is spin coated onto a substrate, and subsequently baked in an atmosphere of oxidizing gas at an oxidizing gas concentration between 0.1% or more and 21% or less, an oxidative coupling reaction is caused even without using a transition metal catalyst having been conventionally used for the oxidative coupling reaction, thereby enabling to cure the coated film.

Moreover, the present invention provides a patterning process for forming a pattern on a substrate by a lithography, comprising at least the steps of:

forming a resist underlayer film on the substrate by the above-described process of the present invention for forming a resist underlayer film;

forming a resist intermediate layer film on the resist underlayer film by using a resist intermediate layer film composition containing a silicon atom;

forming a resist upper layer film on the resist intermediate layer film by using a resist upper layer film composition composed of a photoresist composition;

conducting exposure of a pattern circuit region of the resist upper-layer film, subsequently developing the upper layer film by a developer to form a resist pattern in the resist upper layer film, and etching the resist intermediate film by using the thus obtained resist pattern as an etching mask, to form a resist intermediate film pattern;

etching the resist underlayer film by using the thus obtained resist intermediate film pattern as an etching mask, to form a resist underlayer film pattern; and etching the substrate by using the thus obtained resist underlayer film pattern as an etching mask, to form a pattern on the substrate.

Such a patterning process adopting a three-layer resist process is capable of forming a fine pattern on a substrate, with a higher precision.

The present invention further provides a patterning process for forming a pattern on a substrate by a lithography, comprising at least the steps of:

forming a resist underlayer film on the substrate by the above-described process of the present invention for forming a resist underlayer film;

forming an inorganic hard mask intermediate film selected from among a silicon oxide film, a silicon nitride film, and a silicon oxynitride film on the resist underlayer film;

forming a resist upper layer film on the inorganic hard mask intermediate film by using a resist upper layer film composition composed of a photoresist composition;

conducting exposure of a pattern circuit region of the resist upper layer film, subsequently developing the upper layer film by a developer to form a resist pattern in the resist upper layer film, and etching the inorganic hard mask intermediate film by using the thus obtained resist pattern as an etching mask, to form an inorganic hard mask intermediate film pattern;

etching the resist underlayer film by using the thus obtained inorganic hard mask intermediate film pattern as an etching mask, to form a resist underlayer film pattern; and etching the substrate by using the thus obtained resist underlayer film pattern as an etching mask, to form a pattern on the substrate.

In this way, adopting the resist underlayer film-forming composition of the present invention in forming an inorganic hard mask as a resist intermediate layer film on the resist underlayer film, allows for formation of the resist underlayer film having a higher heat resistance durable against a high-temperature treatment upon formation of the inorganic hard mask intermediate film.

Moreover, the present invention provides a patterning process for forming a pattern on a substrate by a lithography, comprising at least the steps of:

forming a resist underlayer film on the substrate by the above-described process of the present invention for forming a resist underlayer film;

forming an inorganic hard mask intermediate film selected from among a silicon oxide film, a silicon nitride film, and a silicon oxynitride film on the resist underlayer film;

forming an organic antireflective film on the inorganic hard mask intermediate film;

forming a resist upper layer film on the organic antireflective film by using a resist upper layer film composition composed of a photoresist composition;

conducting exposure of a pattern circuit region of the resist upper layer film, subsequently developing the upper layer film by a developer to form a resist pattern in the resist upper layer film, and etching the organic antireflective film and the inorganic hard mask intermediate film by using the thus obtained resist pattern as an etching mask, to form an inorganic hard mask intermediate film pattern;

etching the resist underlayer film by using the thus obtained inorganic hard mask intermediate film pattern as an etching mask, to form a resist underlayer film pattern; and etching the substrate by using the thus obtained resist underlayer film pattern as an etching mask, to form a pattern on the substrate.

In this way, the organic antireflective film can be formed between the inorganic hard mask intermediate film and the resist upper layer film.

Further, it is preferable that the inorganic hard mask intermediate film is formed by a CVD method or an ALD method.

In this way, the inorganic hard mask intermediate film is formed by the CVD method or the ALD method, thereby enhancing the etching resistance.

As explained above, adopting the resist underlayer film-forming composition of the present invention allows for obtainment of a resist underlayer film which is not only excellent in characteristic to fill up a height difference present on a substrate, while having a solvent resistance and preventing twisting of a pattern of 40 nm or less upon formation of the pattern, but also capable of obtaining an excellent pattern which is less in roughness. Thus, the resist underlayer film is promising as one for a multi-layer resist process such as a silicon-containing two-layer resist process, a three-layer resist process using a silicon-containing intermediate layer film, or the like. Particularly, adopting the resin, which is optimized in etching characteristic relative to the fullerene compound, enables to more assuredly restrict deterioration of pattern roughness to a minimal extent.

BRIEF DESCRIPTION OF THE DRAWINGS

FIG. 1 is an explanatory view of a three-layer resist process.

DETAILED DESCRIPTION OF THE PREFERRED EMBODIMENTS

The present invention will be described hereinafter in more detail.

As described above, as a film-forming composition which is low in hydrogen atom content ratio and which can be coated and formed into a film, films each containing a fullerene derivative have been conventionally proposed for prevention of twisting up to now, which fullerene derivative is extremely high in carbon ratio. However, even when twisting of a pattern can be prevented, those compositions which result in considerable surface roughness of completed patterns are not practical, due to accompanying problems such as an increased probability of disconnection of resultant wiring, deterioration of parasitic capacitance, and the like, so that composition control at a molecular level is particularly demanded for a resist underlayer film-forming composition for forming an ultra fine wiring having a line width of 40 nm or less.

The present inventors have conducted the following investigations, so as to achieve the above object.

Conventionally, some fullerene-containing underlayer film-forming compositions have been proposed, as described above. They can be generally classified into two cases, i.e., a case where the fullerene is used as a reinforcing material for a resin in a so-called relationship of resin and filler, and another case where the fullerene is used as a main component for forming a underlayer film.

In case of preparing a underlayer film-forming composition by adopting fullerenes as a main component, it is difficult to obtain a solvent resistance unless a bond between the fullerenes themselves is formed, in a manner to cause such an anxiousness that the obtained underlayer film is damaged by a coating material to be used on the underlayer film in the next step. At this time, to cure the fullerene compounds between themselves, typically known diisocyanates, epoxys, benzoguanamines, melamines, glycolurils, or the like, are each used as a curing agent. However, using such a compound inevitably causes a distribution of a fullerene portion and a curing agent portion within a film after curing. Particularly, it is concerned that, in an area where a line width of an etching pattern is 40 nm or less, a pattern roughness after etching is affected due to a difference of etching performance between the fullerene compound and the curing agent. In turn, since fullerenes each exhibits an absorption over a range from visible light to near infrared light, exclusive usage of fullerene is substantially impossible because troubles in wafer alignment, coated film thickness management, and the like are then caused in an actual semiconductor production process.

Meanwhile, in case of a resist underlayer film-forming composition containing a resin and a fullerene, it is naturally preferable that the used resin has a higher etching resistance. Although it is typical to use each of diisocyanates, epoxys, benzoguanamines, melamines, glycolurils, or the like as a curing agent for curing such a resin component in the same manner as the above, such a curing agent component is typically inferior in etching resistance as compared to a resin component having a higher etching resistance. As such, it is supposed that portions having different etching resistances are caused in a finished film in the same manner as the above, thereby adversely affecting a pattern roughness after etching. Further, in the same manner as the above, it is supposed that the difference between etching resistances of a fullerene portion and a curing agent portion also leads to deterioration of pattern roughness.

Nonetheless, the present inventors have found out that it is possible to obtain a resist underlayer film which is excellent in property for filling up a height difference of a substrate, possesses a solvent resistance, and is not only capable of preventing occurrence of twisting of the underlayer film itself during etching of a substrate, but also capable of providing an excellently decreased pattern roughness after etching; by using a resist underlayer film-forming composition comprising, at least:

a resin (A) obtained by condensing a compound represented by the following general formula (1) with a compound represented by the following general formula (2) by the aid of an acid catalyst;
a compound (B) represented by the general formula (1);
a fullerene compound (C); and
an organic solvent,

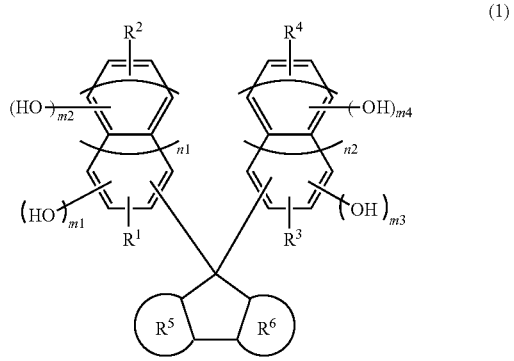

(1)

wherein,
$R^1$, $R^2$, $R^3$, and $R^4$ are the same or different from one another, and are each a hydrogen atom, or a hydrocarbon group having 6 to 22 carbon atoms, which hydrocarbon group may contain an oxygen atom or a hydroxyl group;
$R^5$ and $R^6$ are each a benzene ring or a naphthalene ring;
$1 \leq m1+m2 \leq 2$;
$1 \leq m3+m4 \leq 2$; and
n1 and n2 are each 0 or 1,

(2)

Wherein,
$R^7$ is a hydrogen atom, a saturated or unsaturated linear, branched, or cyclic hydrocarbon group having to 20 carbon atoms, or an aromatic hydrocarbon group having 6 to 20 carbon atoms, which hydrocarbon groups may contain an ether group, a nitro group, a hydroxyl group, or a chloro group.

Namely, the resist underlayer film-forming composition of the present invention contains the above-mentioned resin (A) and the above-mentioned compound (B), in addition to the fullerene compound (C) which is low in hydrogen atom content ratio and is extremely high in carbon ratio. The resin (A), and the compound (8) which is used as a curing agent, are subjected to an oxidative coupling reaction therebetween to cure while causing dehydrogenation, thereby enabling to decrease the number of hydrogen atoms in a resist underlayer film after formation thereof. Typically, those compositions, which are each less in the number of hydrogen atoms in a film after formation thereof, are said to be preferable as a requirement for prevention of twisting of a underlayer film due to etching (Jpn. J. Appl. Phys., Vol. 46, No. 7A, 4286-4288 (2007), and the like), and the underlayer film obtained through the oxidative coupling reaction in the above manner is allowed to decrease the number of hydrogen atoms in the film and thus to be less in twisting after etching, thereby possessing an excellent nature. Further, the underlayer film is capable of exhibiting a resistance against a coating solution to be applied onto the underlayer film itself in the next step. Moreover, the present inventors have conceived that it is possible to improve a pattern roughness of such a film after etching because the non-homogeneity of components at a molecular level within the film is remarkably less as compared to that in case of usage of the conventionally used curing agent, by adopting, as a curing agent, the compound (B) having a structure which is the same as or similar to that of the compound as a precursor of the resin (A).

The present invention will be described hereinafter in more detail.

The resist underlayer film-forming composition of the present invention contains the resin (A) obtained by condensing a compound represented by the above general formula (1) with a compound represented by the above general formula (2) by the aid of an acid catalyst.

Here, examples of the compound represented by the general formula (1) specifically include the following:

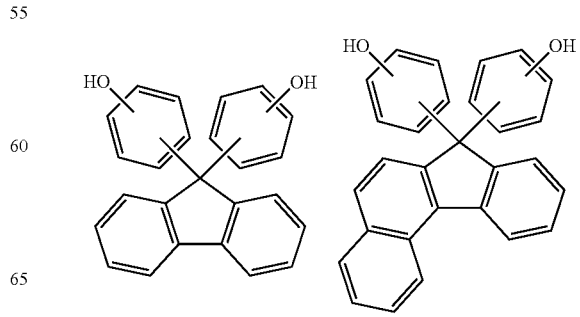

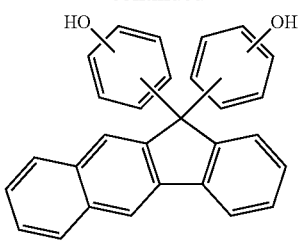
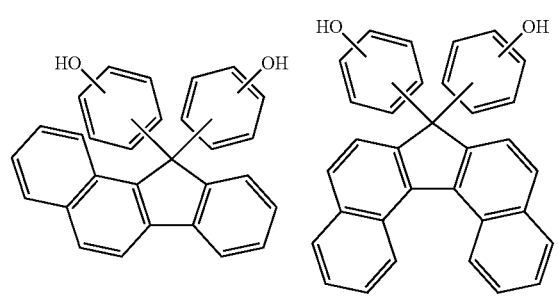
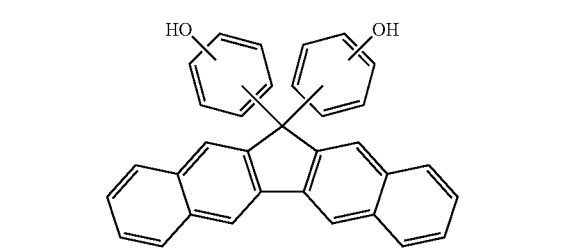
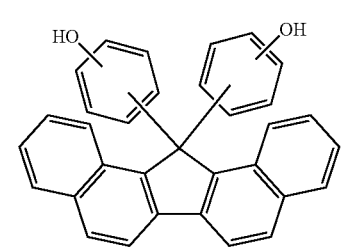
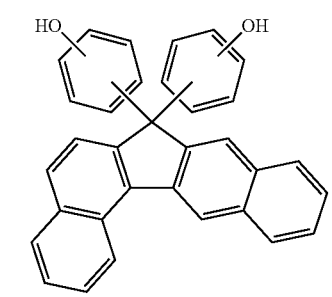
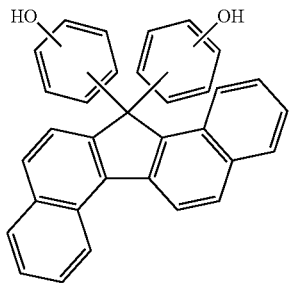
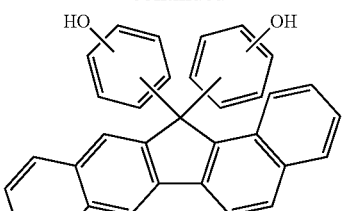
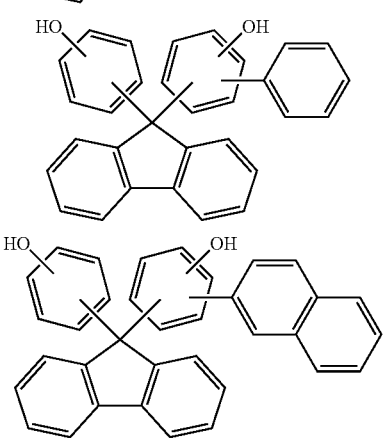
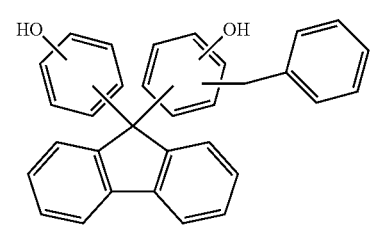
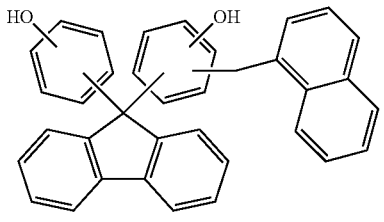
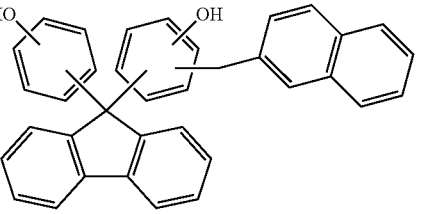
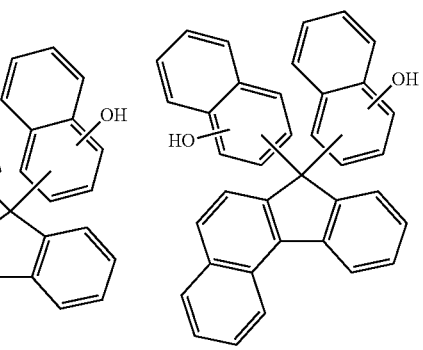

-continued
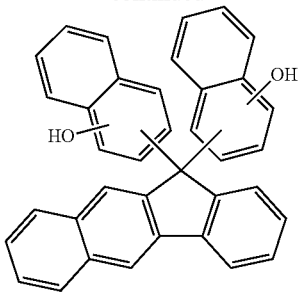
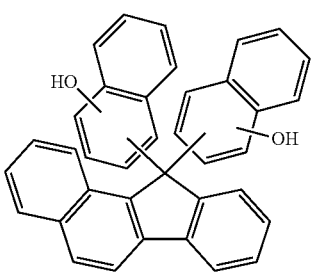
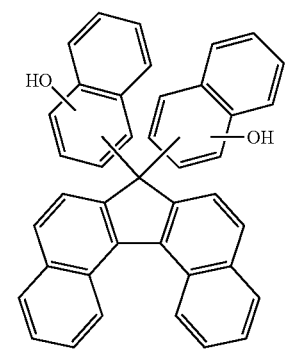
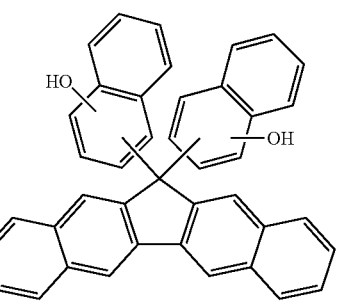
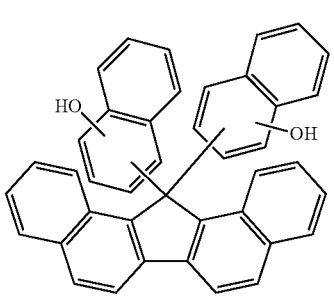
-continued
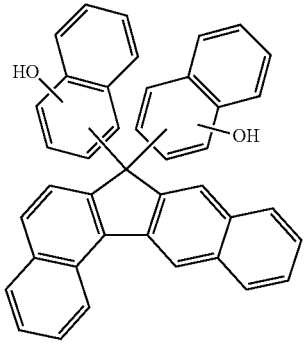
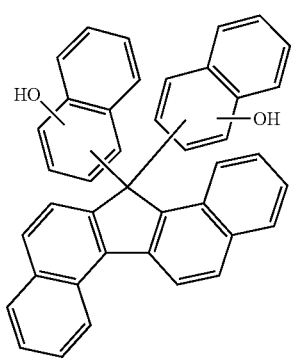
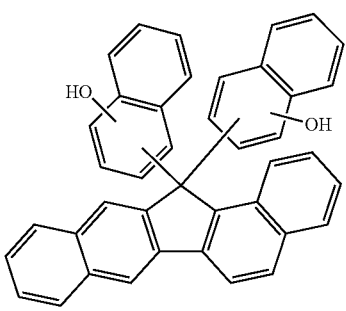
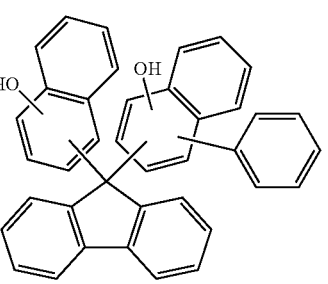
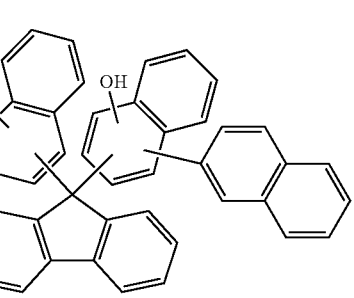

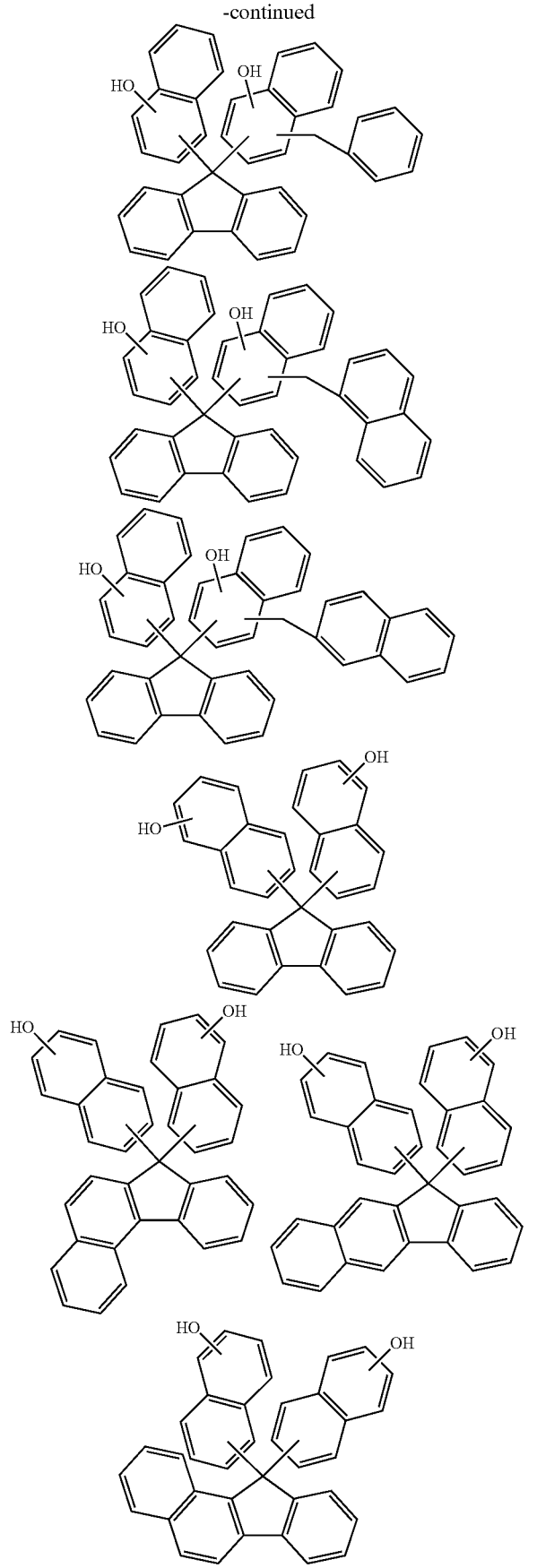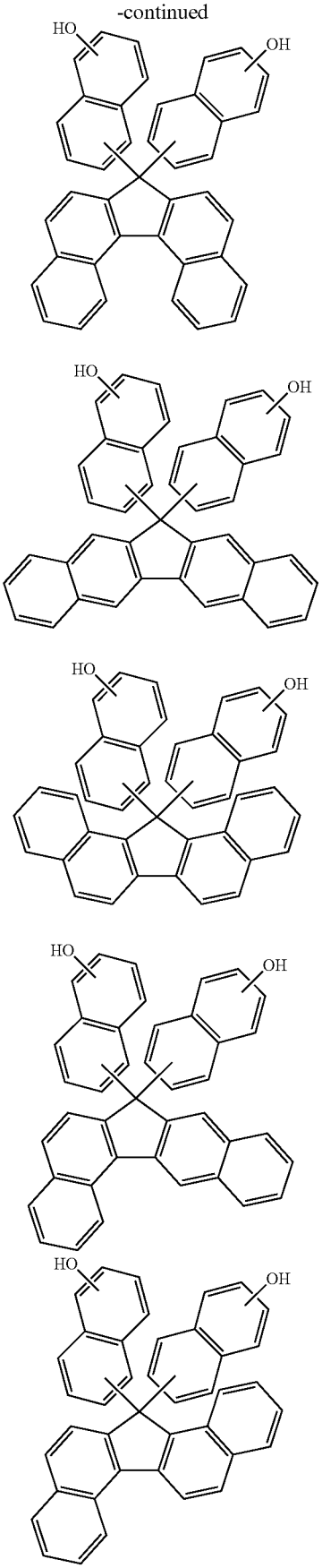

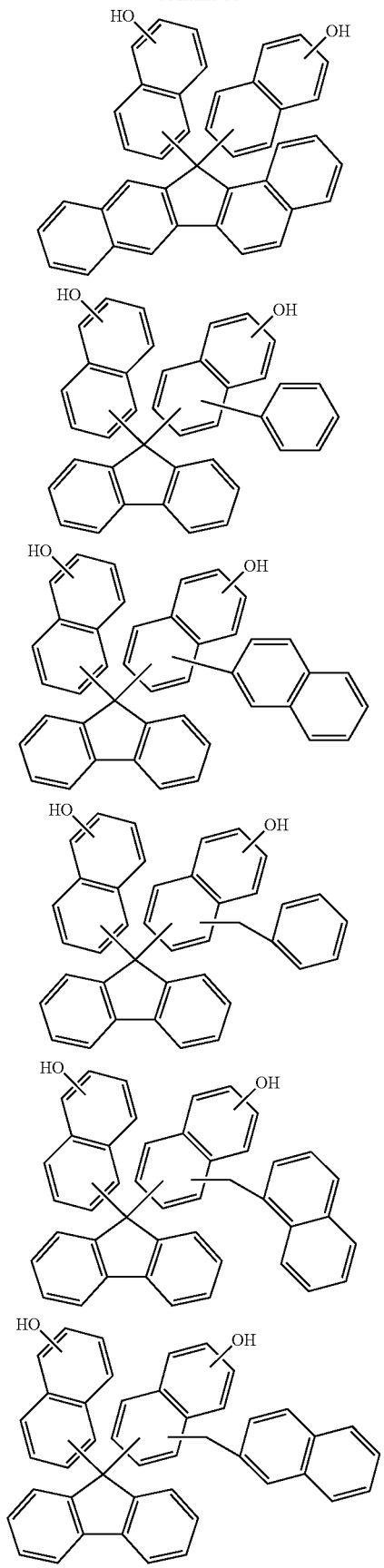
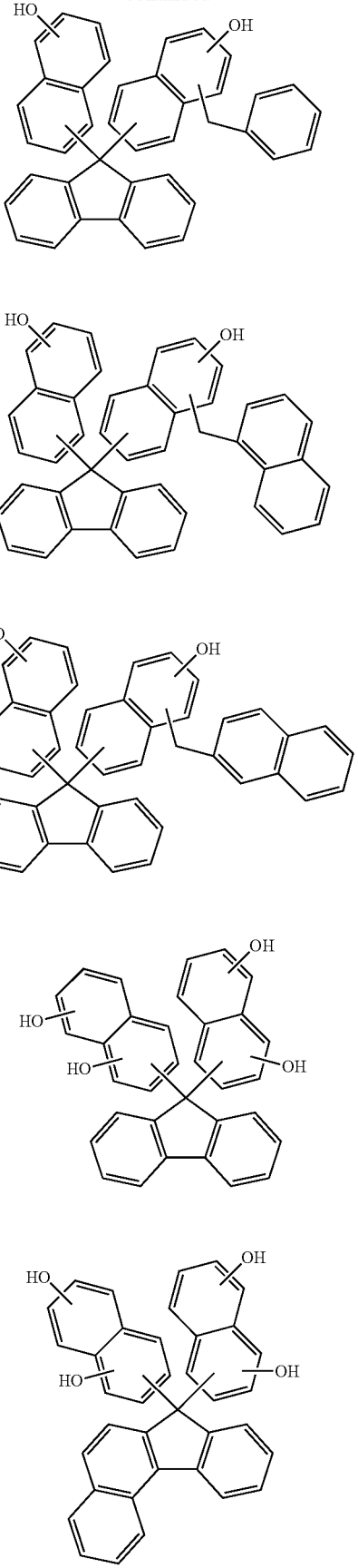

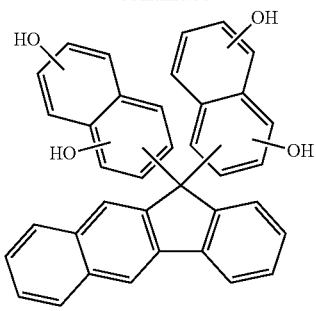
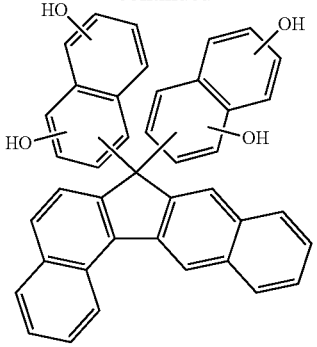
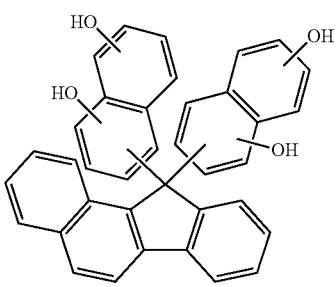
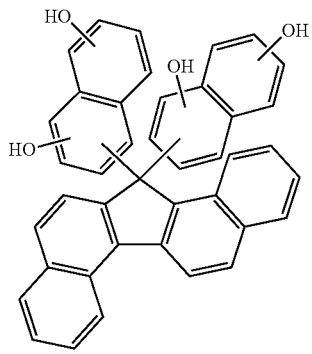
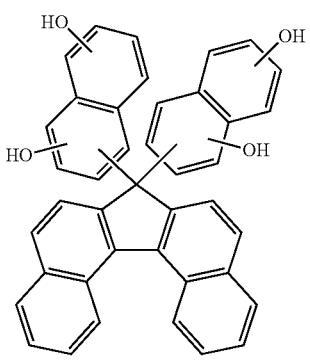
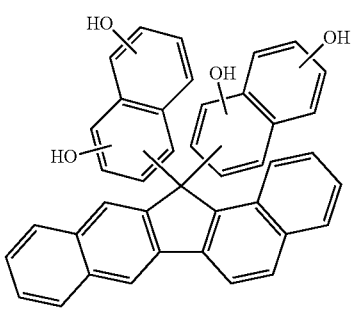
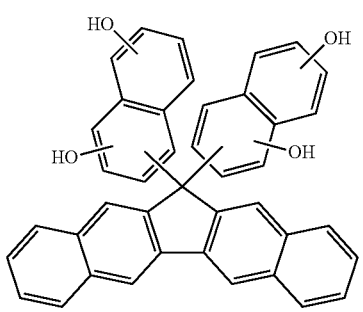
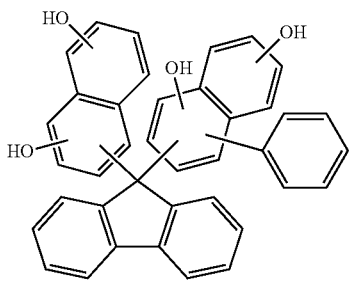
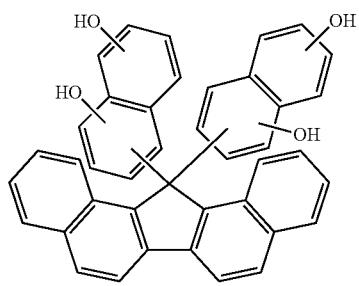
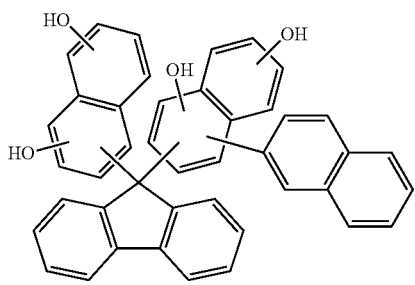

-continued

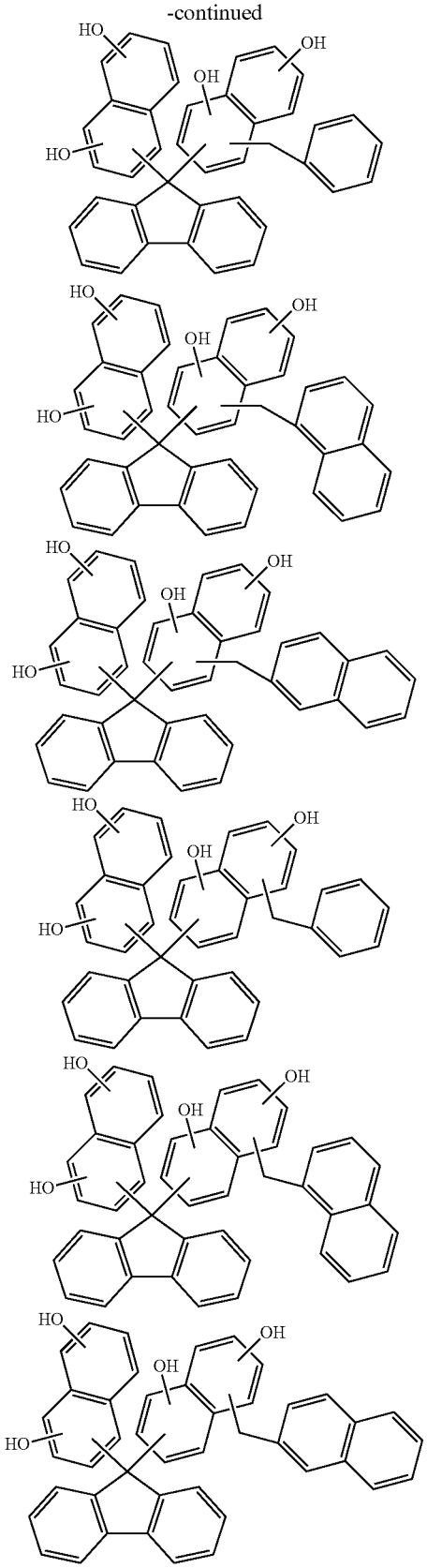

In case of forming an inorganic hard mask intermediate film such as a silicon oxide film, silicon nitride film, or silicon oxynitride film on a resist underlayer film by CVD or the like, high temperatures exceeding 300° C. are required particularly in case of intermediate films based on nitride films, so that the resist underlayer film is also required to possess a higher heat resistance.

The compound represented by the general formula (1) has a cardo structure based on a quaternary carbon and thus possesses an extremely high heat resistance, and is therefore desirable for a resist underlayer film.

Further, among the above exemplified compounds represented by the general formula (1), those compounds are preferable where n1=n2=1, and those compounds represented by the following general formula (3) are particularly preferable,

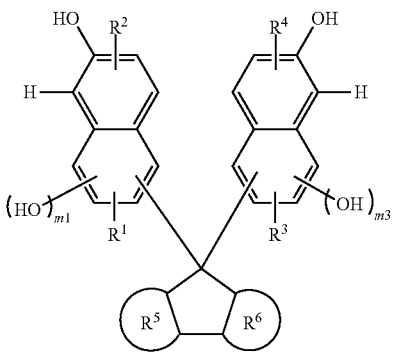

(3)

Wherein,
$R^1, R^2, R^3, R^4, R^5$, and $R^6$ are the same meanings as before; and
m1 and m3 are each 0 or 1.

When the compound represented by the general formula (1) for obtaining the resin (A) of the resist underlayer film-forming composition of the present invention, and the compound (B) to be used as a curing agent and represented by the general formula (1), are exemplarily such compounds where n1=n2=1, particularly such a compounds represented by the above general formula (3), respectively, the bisnaphthol structure of each compound possesses substantially the same resistance against etching by a fluorocarbon-based gas as that of the fullerene compound (C). This exhibits, not only such an effect to prevent twisting of a pattern of the resist underlayer film under an etching condition upon substrate-etching which effect is provided by virtue of introduction of the fullerene compound, but also such an effect to restrict a deterioration of pattern roughness after etching to a minimal extent which deterioration is considered to be caused by a structural non-uniformity within the underlayer film upon etching, to thereby enable to obtain a substrate which is less in pattern roughness.

As the resin (A), the resist underlayer film-forming composition of the present invention is configured to use a resin to be obtained by a condensation reaction between a compound represented by the above general formula (1) and an aldehyde represented by the above general formula (2). Examples of the aldehyde represented by the general formula (2) include formaldehyde, benzaldehyde, acetaldehyde, propylaldehyde, phenylacetaldehyde, α-phenyipropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthaldehyde, 2-naphthaldehyde, furfural, and the like. Particularly preferable are formaldehyde, benzaldehyde, 1-naphthylaldehyde, and 2-naphthylaldehyde.

Among them, formaldehyde is particularly preferably usable. Further, the above aldehydes may be used solely in one kind, or mixedly in two or more kinds. The usage amount of the aldehyde is preferably 0.2 to 5 moles, and more preferably 0.5 to 2 moles, relative to 1 mole of the compound represented by the general formula (1).

As a supplying form of formaldehyde other than a typically used form of formaldehyde water solution, any compounds are usable such as paraformaldehyde, hexamethylenetetramine, and acetals such as formaldehyde dimethyl acetal, insofar as each compound exhibits the same reactivity as formaldehyde during a polycondensation reaction.

Further, while the resin (A) is obtained by condensing the compound represented by the general formula (1) with the compound represented by the general formula (2) by the aid of an acid catalyst, examples of the acid catalyst specifically include those acid catalysts such as hydrochloric acid, nitric acid, sulfuric acid, formic acid, oxalic acid, acetic acid, methanesulfonic acid, camphorsulfonic acid, tosylic acid, trifluoromethane sulfonic acid, and the like. The usage amount of each acid catalyst is preferably $1 \times 10^{-5}$ to $5 \times 10^{-1}$ mole relative to 1 mole of the compound represented by the general formula (1).

Usable as a reaction solvent in the polycondensation, are water, methanol, ethanol, propanol, butanol, tetrahydrofuran, dioxane, a mixed solvent thereof, and the like. These solvents are each preferably used within a range of 0 to 2,000 mass parts relative to 100 mass parts of reaction starting materials.

The reaction temperature is appropriately selectable depending on the reactivities of the reaction starting materials, and is typically within a range of 10 to 200° C.

Examples of a process of polycondensation include: a method configured to collectively charge the compound represented by the general formula (1), the compound represented by the general formula (2), and the acid catalyst, into a system; a method configured to supply, in a dropwise manner, the compound represented by the general formula (1) and the compound represented by the general formula (2) into a system in the presence of the catalyst; and the like. After termination of the polycondensation reaction, the temperature of a reaction pot is elevated to 130 to 230° C. so as to remove unreacted fractions of the reaction starting materials, the acid catalyst, and the like which are present in the system, thereby enabling to remove volatile fractions at about 1 to 50 mmHg.

While the compound represented by the general formula (1) may be solely polymerized in one kind, the compound is usable in two or more kinds by combining it with other compound(s) represented by the general formula (1).

The molecular weight, i.e., weight-average molecular weight (Mw), of the resin (A) obtained by condensing the compound represented by the general formula (1) with the compound represented by the general formula (2) by the aid of the acid catalyst, which molecular weight is to be determined relative to polystyrene standards, is preferably 1,000 to 30,000, and particularly preferably 1,500 to 20,000. Preferably used is a molecular weight distribution within a range of 1.2 to 7.

Next, it is possible to introduce a condensed aromatic or alicyclic substituent group into the resin (A) at its ortho position relative to its hydroxy group.

Here, examples of a substituent group which can be introduced, specifically include the following:

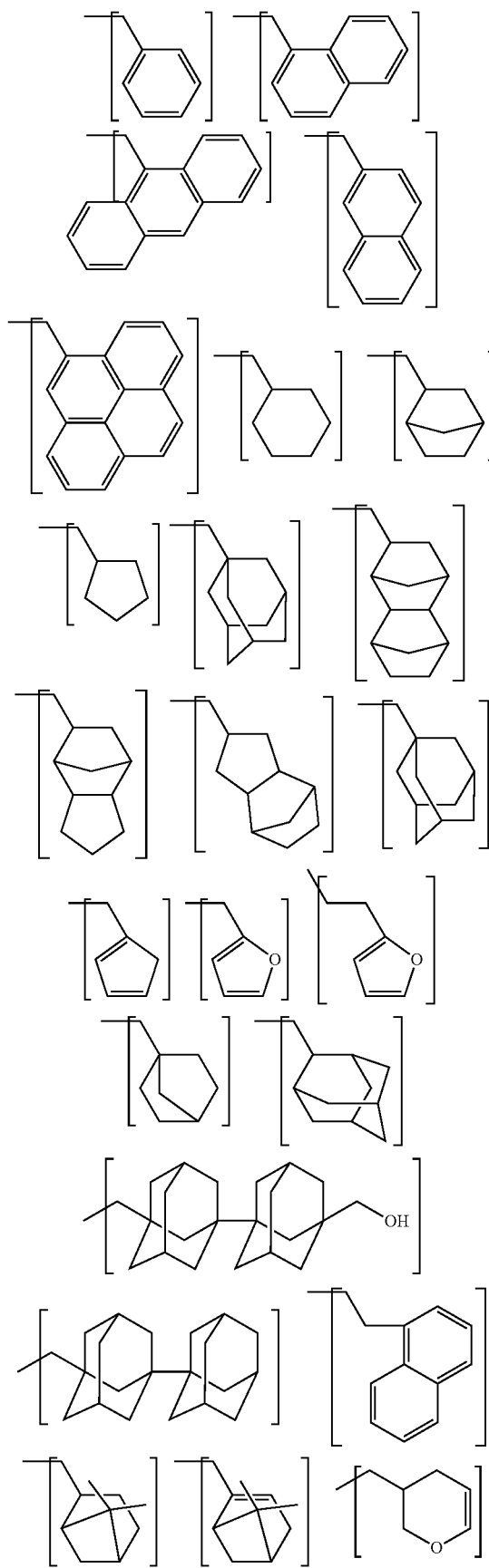

-continued

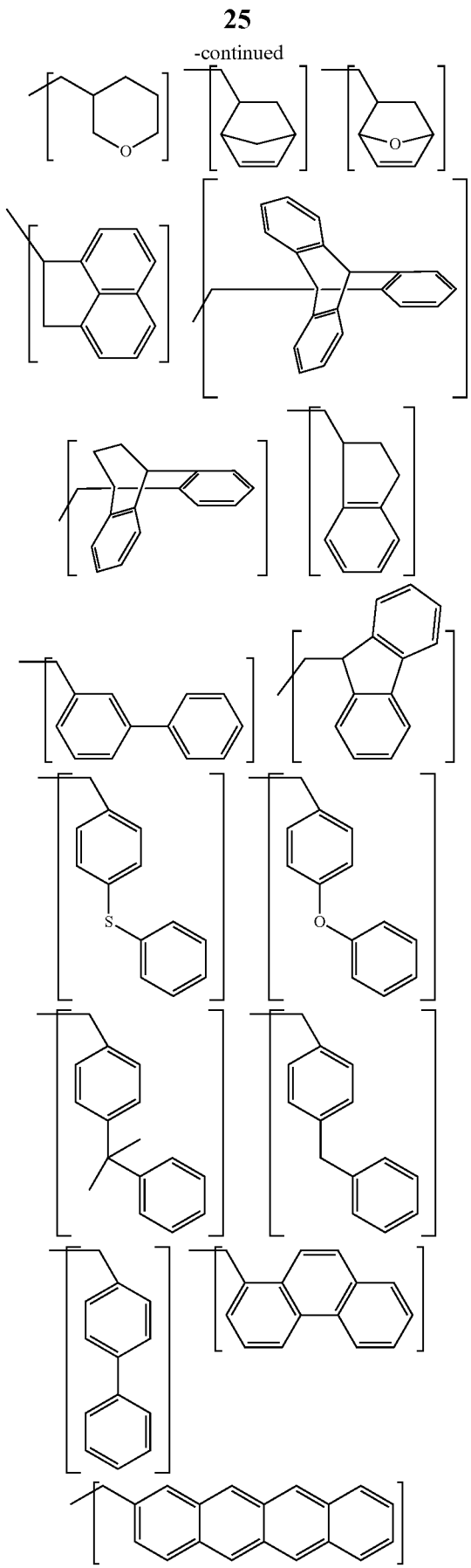

-continued

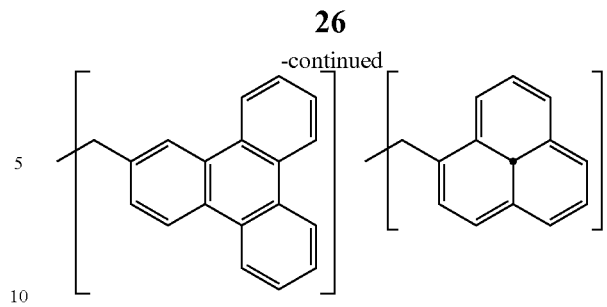

Among them, the naphthalene ring, anthracene ring, and pyrene ring are to be preferably used, because they each exhibit an effect to improve an etching resistance.

Examples of a process for introducing the substituent group include a process configured to introduce: the substituent group in an alcohol form where its bonding site is provided by a hydroxy group; into an ortho or para position of the compound structure, relative to its hydroxy group, which compound is represented by the general formula (1) in the resin after polymerization; in the presence of the acid catalyst. Usable as the acid catalyst are those acid catalysts such as hydrochloric acid, nitric acid, sulfuric acid, formic acid, oxalic acid, acetic acid, methanesulfonic acid, n-butanesulfonic acid, camphorsulfonic acid, tosylic acid, trifluoromethane sulfonic acid, and the like. The usage amount of each acid catalyst is preferably $1 \times 10^{-5}$ to $5 \times 10^{-1}$ mole relative to 1 mole of the compound represented by the general formula (1) to be used for obtaining the resin (A), and the introducing amount of the substituent group is preferably within a range of 0 to 0.8 mole relative to 1 mole of the hydroxy groups of the compound represented by the general formula (1).

Further, the resist underlayer film-forming composition of the present invention contains the compound (B) represented by the general formula (1), as a curing agent.

As explained above, although diisocyanates, epoxys, benzoguanamines, melamines, glycolurils, and the like, have been conventionally used as curing agents for curing resin components, these curing agent components are each inferior in etching resistance as compared to a resin component, thereby bringing about a problem to adversely affect a pattern roughness after etching.

However, the resist underlayer film-forming composition of the present invention includes, as the curing agent, the compound (B) represented by the general formula (1) and having a structure which is the same as or similar to that of a repeating unit in the resin (A), thereby enabling to improve a non-homogeneity of composition within the film, to thereby restrict deterioration of pattern roughness.

Particularly preferable as the compound (B) is one having the same structure as that of the compound (I) to be used for production of the resin (A). Using a compound having the same structure (i.e., a compound having the same structure as that of a precursor of the resin (A)), enables to control a distribution of the compounds in the film at a molecular level, thereby restricting deterioration of pattern roughness after etching.

The fullerene compound (C) usable in the present invention will be explained hereinafter.

The "fullerene" shows a carbon cluster in a closed shell shape formed of carbon atoms arranged in a spherical shape or rugby ball shape. The number of carbon atoms thereof is typically between 60 or more and 120 or less. Examples thereof include $C_{60}$, $C_{70}$, $C_{76}$, $C_{62}$, $C_{84}$, $C_{90}$, and the like. Shown below is a fullerene framework of fullerene $C_{60}$. It is noted that single bonds and double bonds are not differentiated from one another in the following formula, and are both represented by solid lines or broken lines, respectively.

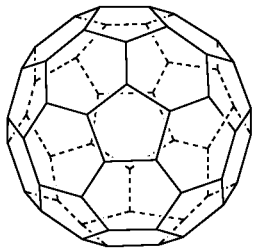

Framework of fullerene $C_{60}$

Examples of the fullerene compound (C) of the present invention include $C_{60}$, $C_{70}$, $C_{76}$, $C_{82}$, $C_{84}$, $C_{90}$ as noted above, derivatives thereof, and the like. Usable as these fullerenes are commercially available ones, respectively. Preferably usable as the fullerene compound (C) of the present invention are $C_{60}$ and/or $C_{70}$, and derivatives thereof.

Usable as the fullerene compound (C) of the present invention is a compound having a fullerene framework having a substituent group introduced thereinto. Known compounds are each enough as the fullerene compound (C), and examples thereof include the following compounds. It is noted that the following depiction in the subsequent formulae indicates a fullerene framework, and examples thereof include $C_{60}$, $C_{70}$, $C_{76}$, $C_{82}$, $C_{84}$, $C_{90}$, and the like, as noted above:

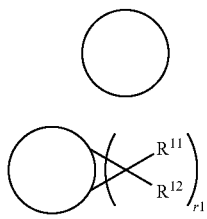

(C-1)

(See, F. Diederich, L. Isaacs, and D. Philip, Chem. Soc. Rev., 1994, 243; Z. Li, K. H. Bouhardir, and P. B. Shevlin, Tetrahedron Lett., 37, 4651 (1996); and the like)

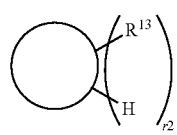

(C-2)

(See, A. Hirsch, T. Grosser, A. Skiebe, and A. Soi, Chem. Ber., 126, 1061 (1993); M. Sawamura, H. Iikura, and E. Nakamura, J. Am. Chem. Soc., 118, 12850 (1996); and the like)

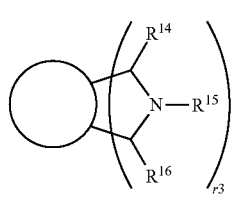

(C-3)

(See, M. Prato, M. Maggini, C. Giacometti, G. Scorrano, G. Sandona, and G. Farnia, Tetrahedron, 52, 5221 (1996); X. Zhang, M. Willems, and C. S. Foote, Tetrahedron Lett., 34, 8187 (1993); and the like)

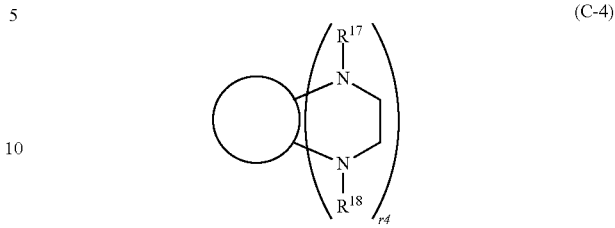

(C-4)

(See, K. -D. Kampe, N. Egger, and M. Vogel, Angew, Chem. Int. Ed. Engl., 32, 1174 (1993); and the like)

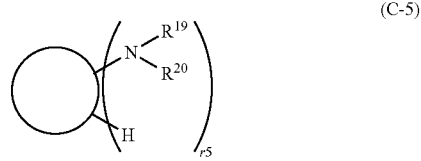

(C-5)

(See, A. Skiebe, A. Hirsch, H. Klos, and B. Gotschy, Chem. Phys. Lett., 220, 138 (1994); A. Hirsch, Q. Li, and F. Wudl, Angew. Chem. Int. Ed. Engl., 30, 1309 (1991); and the like)

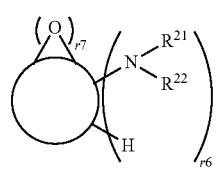

(C-6)

(See, G. Schick, K. D. Kampe, and A. Hirsch, J. Chem. Soc., Chem. Commun., 1995, 2023; and the like)

In the above general formula, $R^{11}$ to $R^{22}$ are not particularly limited; and in an independent manner in each of the general formulae, these groups are the same or different from one another, and are each a saturated or unsaturated linear or cyclic hydrocarbon group having 1 to 15 carbon atoms; where the hydrocarbon group may contain a thioether group, an ether group, an amino group, or a carboxyl group, and a hydrogen atom(s) of the hydrocarbon group may be substituted with a nitrogen-containing group, an oxygen-containing group, or the like. r1 to r7 each represent an added number of substituent groups.

Without limited to the above-described reactions, modification reactions of fullerenes have been numerously known. In general, such reactions have been disclosed in Quarterly Chemical Reviews 43, "Chemistry of fullerene, the third allotrope of carbon", Edited by Chemical Society of Japan, and published by Society Publishing Center (1999), and fullerene compounds other than those noted above are each usable as the fullerene compound (C) of the present invention.

Further, when the weight of the substituent group moiety introduced onto fullerene of the fullerene compound and the weight of the structure constituting the fullerene framework are kept in a specific relationship in case of the resist underlayer film-forming composition of the present invention, the fullerene compound exhibits an excellent dispersibility in the mixture of the resin (A) and compound (B) of the present invention.

Namely, in case of the following fullerene compound,

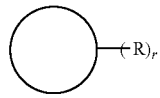

(R represents a substituent group, and r indicates an added number of substituent groups R)
the fullerene compound exhibiting an excellent dispersibility in the resist underlayer film-forming composition of the present invention, is defined by the following equation:

$$0.5 \times Wf \le Wr \times r \le Wf \times 3$$

wherein Wf represents a formula weight of the fullerene framework, and Wr represents a formula weight of the substituent group R.

Here, when r=1, even if the fullerene compound once appears to have been dissolved in the solution, such a possibility is left that the fullerene compound agglomerates with the lapse of time. Thus, it is preferable that r≥2, for r. While it is practical to obtain a mixture of fullerene compounds having a distribution because it is difficult, due to the nature of a fullerene compound, to produce a fullerene compound where r is kept at a single value, it is more preferable just in case of the present invention to adopt a mixture including no compounds where r=1, in consideration of the dispersibility in the composition.

Such a fullerene compound exhibiting an excellent dispersibility is capable of achieving an excellent pattern roughness after etching, since the fullerene compound avoids a possibility that etching is not uniformly progressed due to an affection of local agglomerates of a used fullerene compound. Further, such an excellently dispersing fullerene compound is preferable, since segregation thereof is not likely to occur during connection to a coating apparatus.

Further, the blending amount Wc of the fullerene compound (C) is to be preferably selected relative to a weight Wa of the resin (A) and a weight Wb of the compound (B), to establish the following relationship:

$$0.2 \times (Wa+Wb) \le Wc \le 5 \times (Wa+Wb)$$

Blending amounts Wc of the fullerene compound of 0.2 part or more relative to the weight of the resin (A) and compound (B), allow for sufficient exhibition of the etching resistance possessed by the fullerene compound, and blending amounts Wc of 5 parts or less are preferable in that it is then possible not only to avoid a lost of alignment upon exposure, but also to avoid such possibilities of deterioration of uniformity of a coated film and of occurrence of cracks in the coated film.

In the present invention, it is preferable to homogeneously disperse the fullerene compound (C) in the composition. Examples of a process to disperse the fullerene compound (C) exemplarily include a method: to once mix the fullerene compound (C) with a solvent; and to thereafter irradiate ultrasonic waves to the mixed solution and then subject the mixed solution to filtration by a filter of 20 nm or less, or to agitate the mixed solution at a boiling point of the solvent and then subject the mixed solution to the same filtration as the above; thereby removing agglomerates from the mixed solution. It is also possible to mix the resin (A) and compound (B) into the thus obtained solution, followed by further irradiation of ultrasonic waves thereto, thereby conducting homogenization at a molecular level.

The organic solvent usable in the resist underlayer film-forming composition of the present invention is not particularly limited, insofar as it allows for dissolution therein of the resin (A), the compound (B), and fullerene compound (C). Specifically, it is possible to adopt an organic solvent described in paragraphs (0091) to (0092) of Japanese Patent Laid-Open (kokai) No. 2007-199653.

In the resist underlayer film-forming composition of the present invention, it is possible to add thereinto a surfactant for improving a coatability in spin coating. Usable as the surfactant is what is described in paragraphs (0165) to (0166) of Japanese Patent Laid-Open (kokai) No. 2008-111103.

Such a resist underlayer film-forming composition of the present invention is used for forming a resist underlayer film for a multi-layer resist process such as a silicon-containing two-layer resist process, or a three-layer resist process based on a silicon-containing intermediate layer film.

For example, in case of the three-layer resist process, it is possible: to coat the resist underlayer film-forming composition of the present invention containing the resin (A), the compound (B), and the fullerene compound (C), onto a substrate; to bake (fire) the substrate at a temperature of 200° C., preferably exceeding 250° C., thereby forming a resist underlayer film; to form a resist upper layer film composed of a photoresist composition on the resist underlayer film, through a resist intermediate layer film; to etch the resist intermediate layer film by using a photoresist pattern as a mask, which is obtained by a dry etching apparatus in a manner to irradiate radiations or the like onto the required area of the photoresist layer, and to develop it by a developer to form the resist pattern; and to process the resist underlayer film and the substrate, by using the above obtained resist intermediate layer film as a mask.

The resist underlayer film-forming composition of the present invention can be coated onto a substrate to be processed such as by spin coating, similarly to a photoresist. Adopting the spin coating or the like, allows for obtainment of an excellent filling-up characteristic. Further, the resist underlayer film-forming composition of the present invention is capable of obtaining a more excellent filling-up characteristic, by virtue of inclusion of the compound (B) as a monomer component. After spin coating, it is preferable to conduct baking thereof in order to evaporate the solvent of the composition, and to promote a cross-linking reaction therein so as to prevent mixing of the composition with a resist upper layer film, a resist intermediate layer film, and the like. It is preferable that the baking is conducted at a temperature within a range between exceeding 200° C. and 600° C. or less, for 10 to 1,200 seconds, preferably for 10 to 300 seconds. The baking temperature is preferably between 300° C. or more and 500° C. or less. In consideration of affections on device damage, wafer deformation, and the like, the upper limit of heating temperature in a wafer process of lithography is 600° C. or lower, and preferably 500° C. or lower.

Moreover, the present invention provides a process for forming a resist underlayer film, comprising at least the steps of:

spin coating the above-described resist underlayer film-forming composition onto a substrate; and subsequently baking the substrate in an atmosphere of oxidizing gas (oxygen, for example) at an oxidizing gas concentration between 0.1% or more and 21% or less.

The resin (A) and the compound (B) in the resist underlayer film-forming composition of the present invention are cured through an oxidative coupling reaction by baking them in the atmosphere of oxidizing gas (for example, oxygen or the like), thereby enabling to exhibit a resistance against a coating solution to be applied in the next step. Further, the underlayer film obtained through the oxidative coupling reaction is enabled to decrease the number of hydrogen atoms therein by the reaction, thereby achieving an excellent nature with decreased twisting after etching.

Although the baking can be typically conducted in air, it is also possible to decrease an oxygen concentration in the ambient atmosphere as the case may be. Examples of a gas usable as a dilution gas at this time include an inert gas such as $N_2$, Ar, He, or the like. Excessively lower oxygen concentrations in the atmosphere lead to slower progression of the oxidative coupling reaction, thereby uneconomically requiring excessively extended baking periods of time. It is thus possible to cure the underlayer film composition at a practical rate, in the presence of oxygen at a concentration of 0.1% or more, and preferably 1% or more. Further, when the oxidizing gas concentration is between 0.1% or more and 21% or less, an oxidative coupling reaction can be caused to cure the coated film, even without using a transition metal catalyst having been conventionally used for the oxidative coupling reaction.

It is noted that, although the thickness of the resist underlayer film is to be appropriately selected, the thickness is to be preferably set at 30 to 20,000 nm, and particularly 50 to 15,000 nm.

Further, the patterning process of the present invention comprises at least the steps of:

forming a resist underlayer film on the substrate by the above-described process for forming a resist underlayer film;

forming a resist intermediate layer film on the resist underlayer film by using a resist intermediate layer film composition containing a silicon atom;

forming a resist upper layer film on the resist intermediate layer film by using a resist upper layer film composition composed of a photoresist composition;

conducting exposure of a pattern circuit region of the resist upper layer film, subsequently developing the upper layer film by a developer to form a resist pattern in the resist upper layer film, and etching the resist intermediate film by using the thus obtained resist pattern as an etching mask, to form a resist intermediate film pattern;

etching the resist underlayer film by using the thus obtained resist intermediate film pattern as an etching mask, to form a resist underlayer film pattern; and etching the substrate by using the thus obtained resist underlayer film pattern as an etching mask, to form a pattern on the substrate.

In this way, in case of a three-layer process, it is possible to once form the resist underlayer film on a substrate according to the present invention, and to subsequently form a silicon-containing resist intermediate layer film on the underlayer film.

Here, in case of forming an inorganic hard mask intermediate layer film on the resist underlayer film, the intermediate film is formed with a silicon oxide film, silicon nitride film, or silicon oxynitride film (SiON film) by a CVD method, an ALD method, or the like. In this way, the inorganic hard mask intermediate film is formed by the CVD method or the ALD method, thereby enhancing the etching resistance. Examples of a method for forming such a nitride film are described in Japanese Patent Laid-Open (kokai) No. 2002-334869, and WO2004/066377A1. The inorganic hard masks are each to have a thickness of 5 to 200 nm, preferably 10 to 100 nm, and the SiON film exhibiting a higher effect as an antireflective film is most preferably used among them. Since the substrate temperature upon formation of a SiON film is elevated to 300 to 500° C., the resist underlayer film is required to withstand temperatures of 300 to 500° C. The resist underlayer film-forming composition of the present invention has a higher heat resistance and is capable of withstanding high temperatures of 300° C. to 500° C., thereby enabling to combine an inorganic hard mask formed by a CVD method or an ALD method, with a resist underlayer film formed by a spin coating method.

Although it is possible to form a photoresist film as a resist upper layer film directly on such a resist intermediate layer film, it is also possible to once form an organic antireflective film (BARC) by spin coating on the resist intermediate layer film and to subsequently form a photoresist film on the antireflective film. In case of adopting a SiON film as the resist intermediate layer film, it is enabled to restrict reflection by virtue of the two-layered antireflective films, i.e., the SiON film and BARC film, even by a liquid immersion exposure at a higher NA exceeding 1.0. Another merit of the formation of the BARC resides in obtainment of an effect to decrease footing (trailing) of a photoresist pattern just above the SiON film.

As the silicon-containing resist intermediate layer film in the three-layer process, a polysilsesquioxane-based intermediate layer film is also preferably used. This makes the resist intermediate layer film to possess an effect as an antireflective film, thereby enabling to restrict reflection. Particularly, when a material configured to contain many aromatic groups so as to possess a higher resistance against substrate-etching is used as a resist underlayer film for 193 nm exposure, a k value is rather increased to increase a substrate reflection. Nonetheless, the reflection is restricted by the resist intermediate layer film, thereby enabling to restrict the substrate reflection down to 0.5% or less. Preferably used as the resist intermediate layer film having an antireflective effect, is a polysilsesquioxane, which has a pendant anthracene, for exposure of 248 nm or 157 nm, or a pendant phenyl group or a pendant light-absorbing group having a silicon-silicon bond, for 193 nm exposure, and which is cross-linked by an acid or a heat. In this case, formation of the silicon-containing resist intermediate layer film by spin coating is more convenient to obtain a merit of cost, than by a CVD method.

The resist upper layer film in the three-layered resist film may be either a positive type or negative type, and it is possible to use therefor the same one as a typically used photoresist composition. In case of forming a single resist upper layer film by the photoresist composition, spin coating is to be preferably used similarly to the case for forming the resist underlayer film. Prebaking is to be conducted after spin coating of the photoresist composition, preferably at 60 to 180° C. for 10 to 300 seconds. Thereafter, exposure is to be conducted according to a usual manner, followed by post-exposure baking (PEE) and development, to thereby obtain a resist pattern. Although the thickness of the resist upper layer film is not particularly limited, the thickness is to be preferably 30 to 500 nm, particularly 50 to 400 nm.

Further, examples of light for exposure include high energy beams at wavelengths of 300 nm or shorter, specifically excimer lasers at 248 nm, 193 nm, and 157 nm, soft X-rays at 3 to 20 nm, an electron beam, X-rays, and the like.

Next, etching is to be conducted by using the obtained resist pattern as a mask. Etching of a resist intermediate layer film, particularly an inorganic hard mask in a three-layer resist process, is to be conducted by using the resist pattern as a mask and by adopting a flon-based gas. Next, etching of the resist underlayer film is to be conducted by using the resist intermediate film pattern, particularly the inorganic hard mask pattern as a mask, and by adopting an oxygen gas or hydrogen gas.

The subsequent etching of a substrate to be processed can also be conducted according to a usual manner, such that etching mainly based on a flon (freon)-based gas is conducted for a substrate having SiO$_2$, SiN, or silica-based low dielectric constant insulating film, or etching mainly based on a chlorine-based or bromine-based gas is conducted for a substrate having p-Si, Al, or W. When substrate processing is conducted by etching by a flon-based gas, the silicon-containing intermediate layer in case of the three-layer resist process is stripped simultaneously with the substrate processing. Only, in case of etching of a substrate by a chlorine-based gas or bromine-based gas, stripping of the silicon-containing intermediate layer is required to be separately conducted by dry etching stripping by a flon-based gas after substrate processing.

The resist underlayer film of the present invention is characterized in that the film is excellent in resistance against these etchings of substrate to be processed.

It is noted that examples of a substrate to be processed embrace a layer to be processed formed on a substrate. Examples of a substrate to be used include those made of materials such as Si, α-Si, p-Si, SiO$_2$, SiN, SiON, W, TiN, Al, and the like, without particularly limited thereto, which materials are different from those of layers to be processed. Examples of a layer to be processed to be used include: various low-k films such as made of Si, SiO$_2$, SiON, SiN, p-Si, α-Si, W, W—Si, Al, Cu, Al—Si, and the like; and stopper films therefor; which can each be typically formed into a thickness of 50 to 10,000 nm, particularly 100 to 5,000 nm.

The three-layer resist process will be specifically explained for an example thereof with reference to FIG. 1, as follows.

In case of a three-layer resist process, the process is configured to form a resist underlayer film 3 of the present invention on a layer to be processed 2 laminated on a substrate 1, to thereafter form a resist intermediate layer film 4 thereon, and to form a resist upper layer film 5 thereon, as shown in FIG. 1(A).

Next, as shown in FIG. 1(B), exposure is conducted for required portions 6 of the resist upper layer film, followed by PEB and development, to form a resist pattern 5a (FIG. 1(C)). The thus obtained resist pattern 5a is then used as a mask, to etch the resist intermediate layer film 4 by using a CF-based gas, to thereby form a resist intermediate layer film pattern 4a (FIG. 1(D)). After removing the resist pattern 5a, the obtained resist intermediate layer film pattern 4a is used as a mask to oxygen-plasma etch the resist underlayer film 3, to thereby form a resist underlayer film pattern 3a (FIG. 1(E)). Further, after removing the resist intermediate layer film pattern 4a, the resist underlayer film pattern 3a is used as a mask to etch the layer to be processed 2 (FIG. 1(F)).

In case of using an inorganic hard mask intermediate film, the resist intermediate layer film 4 is the inorganic hard mask intermediate film, and in case of arranging a BARC, a BARC layer is provided between the resist intermediate layer film 4 and the resist upper layer film 5. Etching of the BARC is to be occasionally and continuously conducted prior to etching of the resist intermediate layer film 4, and it is also possible to conduct etching of the BARC only and to subsequently change an etching apparatus to conduct etching of the resist intermediate layer film 4, for example.

EXAMPLES

The present invention will be described specifically with reference to Examples and Comparative Examples, but the present invention is not limited by these descriptions.

Synthesis of Compounds (B)-1 to (B)-3 and Resins (A)-1 to (A)-3

Compounds (B)-1 to (B)-3 and resins (A)-1 to (A)-3 were synthesized as below. It is noted that molecular weight of polymer was measured specifically as following. A weight-average molecular weight (Mw) and a number-average molecular weight (Mn) relative to polystyrene were measured by a gel permeation chromatography (GPC), and then dispersivity (Mw/Mn) was obtained.

Compound Synthesis Example 1

Compound (B)-1

Into a 1-L flask were added 90 g of fluorene, 160 g of 2,7-dihydroxy naphthalene, 4 g of β-mercaptopropionic acid and 500 g of toluene. 10 g of 98%; sulfuric acid were dropped into the flask and they were stirred at 80° C. for 10 hours to conduct a reaction. Into the obtained flask were added 100 g of toluene and 30 g of water. Then, 10% aqueous tetramethylammonium hydroxide solution was added into the flask until the solution exhibited PH-value of 7. Washing and separation were conducted five times and a water layer was separated from the resultant mixture to obtain compound (B)-1 described below. Chemical structure analysis was conducted by using $^1$H-NMR analysis Compound Synthesis Example 2

Compound (B)-2

160 g of 1,6-dihydroxy naphthalene was used instead of 160 g of 2,7-dihydroxy naphthalene to conduct the same reaction as above-reaction, thereby obtaining following-mentioned compound (B)-2.

Compound Synthesis Example 3

Compound (B)-3

144 g of 2-naphthol was used instead of 160 g of 2,7-dihydroxy naphthalene to conduct the same reaction as above-reaction, thereby obtaining following-mentioned compound (B)-3.

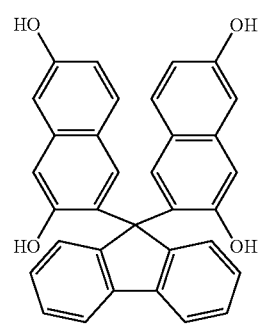

Compound (B)-1

-continued

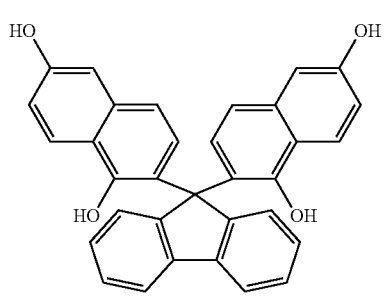
Compound (B)-2

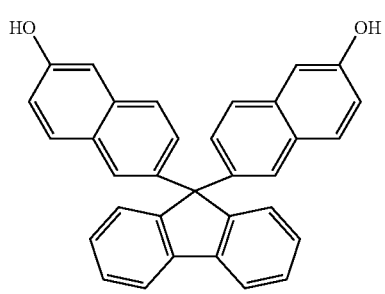
Compound (B)-3

Resin Synthesis Example 1

Resin (A)-1

Into a 1-L flask were added 112.5 g of compound (B)-3, 7 g of 37% aqueous formaline solution, 5 g of paratoluenesulfonic acid, 200 g of dioxane, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain resin (A)-1.

Molecular weight (Mw) and dispersivity (Mw/Mn) were obtained from GPC, and a ratio in the polymer was obtained from $^1$H-NMR analysis. The results are as shown below:
Resin (A)-1: Mw 5,500, Mw/Mn 4.90

Resin Synthesis Example 2

Resin (A)-2

Into a 1-L flask were added 112.5 g of compound (B)-3, 3.5 g of 37% aqueous formaline solution, 6 g of 2-naphthylaldehyde, 5 g of paratoluenesulfonic acid, 200 g of dioxane, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain resin (A)-2.

Molecular weight (Mw) and dispersivity (Mw/Mn) were obtained from GPC, and a ratio in the polymer was obtained from $^1$H-NMR analysis. The results are as shown below:
Resin (A)-2: Mw 5,900, Mw/Mn 5.30

Resin Synthesis Example 3

Resin (A)-3

Into a 300-mL flask were added 50 g of resin (A)-1, 6 g of 9-hydroxymethyl anthracene, 5 g of methane sulfonic acid, 200 g of toluene, and then they were heated with stirring at 120° C. for 2 hours while removing water generated from the reaction. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain resin (A)-3.

Molecular weight (Mw) and dispersivity (Mw/Mn) were obtained from GPC, and a ratio of components in the polymer was obtained from $^1$H-NMR analysis. The results are as shown below:
Resin (A)-3: Mw 6,900, Mw/Mn 4.80

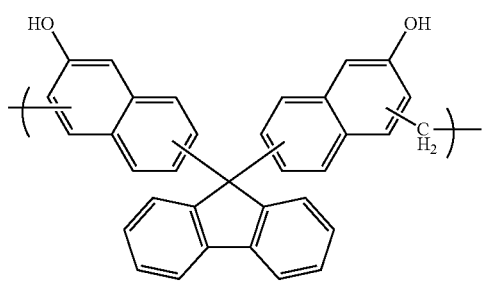
Resin (A)-1

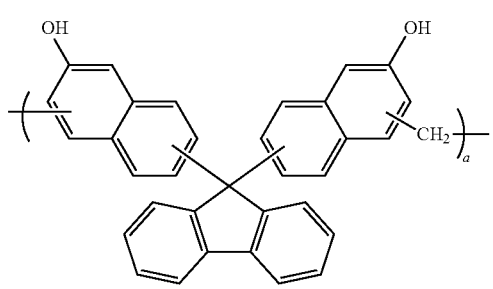
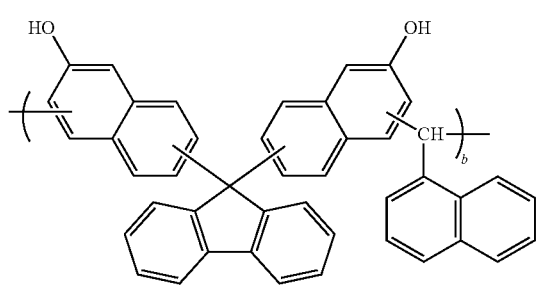
Resin (A)-2

Resin (A)-3

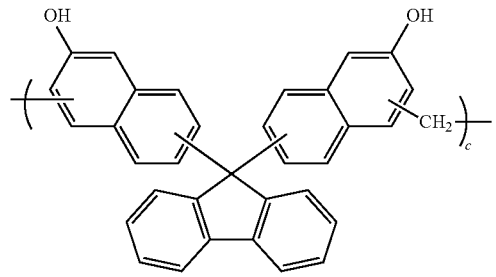
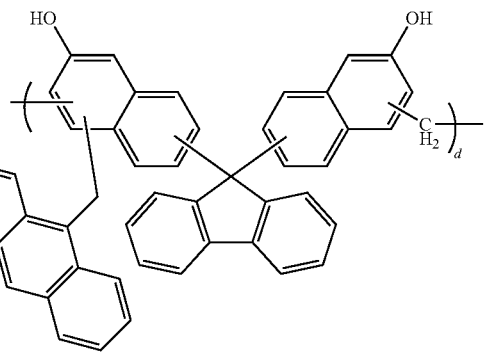

(In the formula, a, b, c and d each represents a mol-ratio and represents a:b=1:1, c:d=3:1)

Preparation of a Resist Underlayer Film-Forming Composition

Above-mentioned resins (A)-1 to (A)-3, above-mentioned compounds (B)-1 to (B)-3, following comparative (A)-1 (Com. (A)-1)), comparative (B)-1 (Com. (B)-1)), fullerene compounds (C)-1 to (C)-5, FC-430 (0.1 mass parts, manufactured by Sumitomo 3M Ltd.) as a surfactant, organic solvent (PGMEA (Propyleneglycol monomethyl ether acetate)) were mixed in the ratio shown in Table 1 and Table 2, and were stirred to become uniformity. The resulting mixture was filtered through a 0.1 μm filter made of a fluorinated polymer to prepare a resist underlayer film-forming composition (UDL-1 to UDL-25 and Com. UDL-1 to UDL-5).

As fullerene compounds (C)-1 to (C)-5, following compounds were used (fullerene framework: $C_{60}$).

Compound (C)-1

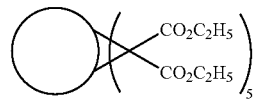

Compound (C)-2

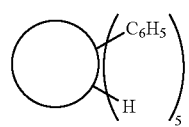

Compound (C)-3

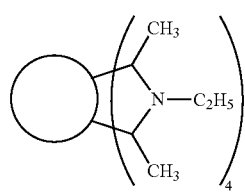

Compound (C)-4

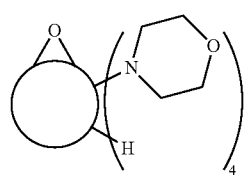

Compound (C)-5

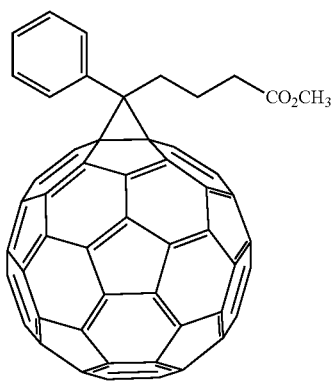

Following were used as comparative (A)-1 and comparative (B)-1.

Comparative (A)-1

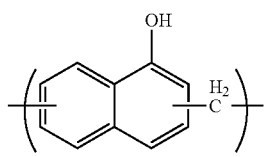

Comparative (B)-1

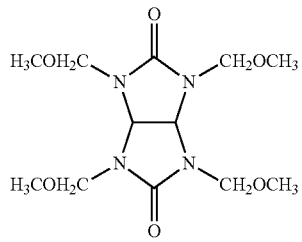

TABLE 1

| No. | Resin (A) (parts by mass) | Compound (B) (parts by mass) | Compound (C) (parts by mass) | Organic Solvent (parts by mass) |
|---|---|---|---|---|
| UDL-1 | (A)-1 (10) | (B)-1 (10) | (C)-1 (20) | (360) |
| UDL-2 | (A)-1 (10) | (B)-1 (10) | (C)-2 (20) | (360) |

TABLE 1-continued

| No. | Resin (A) (parts by mass) | Compound (B) (parts by mass) | Compound (C) (parts by mass) | Organic Solvent (parts by mass) |
|---|---|---|---|---|
| UDL-3 | (A)-1 (10) | (B)-1 (10) | (C)-3 (20) | (360) |
| UDL-4 | (A)-1 (10) | (B)-1 (10) | (C)-4 (20) | (360) |
| UDL-5 | (A)-1 (10) | (B)-2 (10) | (C)-1 (10) | (270) |
| UDL-6 | (A)-1 (10) | (B)-2 (10) | (C)-2 (30) | (450) |
| UDL-7 | (A)-1 (10) | (B)-2 (10) | (C)-3 (50) | (630) |
| UDL-8 | (A)-1 (10) | (B)-2 (10) | (C)-4 (60) | (720) |
| UDL-9 | (A)-2 (10) | (B)-1 (10) | (C)-1 (20) | (360) |
| UDL-10 | (A)-2 (10) | (B)-1 (10) | (C)-2 (20) | (360) |
| UDL-11 | (A)-2 (10) | (B)-1 (10) | (C)-3 (20) | (360) |
| UDL-12 | (A)-2 (10) | (B)-1 (10) | (C)-4 (20) | (360) |
| UDL-13 | (A)-2 (10) | (B)-3 (10) | (C)-1 (10) | (270) |
| UDL-14 | (A)-2 (10) | (B)-3 (10) | (C)-2 (30) | (450) |
| UDL-15 | (A)-2 (10) | (B)-3 (10) | (C)-3 (50) | (630) |
| UDL-16 | (A)-2 (10) | (B)-3 (10) | (C)-4 (60) | (720) |
| UDL-17 | (A)-3 (10) | (B)-2 (10) | (C)-1 (20) | (360) |
| UDL-18 | (A)-3 (10) | (B)-2 (10) | (C)-2 (20) | (360) |
| UDL-19 | (A)-3 (10) | (B)-2 (10) | (C)-3 (20) | (360) |
| UDL-20 | (A)-3 (10) | (B)-2 (10) | (C)-4 (20) | (360) |

TABLE 2

| Composition | Resin (A) (parts by mass) | Compound (B) (parts by mass) | Compound (C) (parts by mass) | Organic Solvent (parts by mass) |
|---|---|---|---|---|
| UDL-21 | (A)-3 (10) | (B)-3 (10) | (C)-1 (10) | (270) |
| UDL-22 | (A)-3 (10) | (B)-3 (10) | (C)-2 (30) | (450) |
| UDL-23 | (A)-3 (10) | (B)-3 (10) | (C)-3 (50) | (630) |
| UDL-24 | (A)-3 (10) | (B)-3 (10) | (C)-4 (60) | (720) |
| UDL-25 | (A)-1 (10) | (B)-1 (10) | (C)-5 (10) | (270) |
| Com. UDL-1 | (A)-1 (10) | (B)-1 (10) | — | (180) |
| Com. UDL-2 | (A)-1 (10) | — | (C)-1 (10) | (180) |
| Com. UDL-3 | — | (B)-1 (10) | (C)-1 (10) | (180) |
| Com. UDL-4 | (A)-1 (10) | Com. (B)-1 (10) | (C)-1 (10) | (189) |
| Com. UDL-5 | Com. (A)-1 (10) | (B)-1 (10) | (C)-1 (10) | (270) |

Measurement of Solvent Resistance

Examples 1 to 28, Comparative Examples 1 to 3

Resist Underlayer Film-Forming Compositions prepared as above were coated on silicon substrates, baked at a condition shown in Table 3 and Table 4, and then a film thickness of each was measured. A PGMEA solution was dispensed on it, allowed to stand for 30 seconds, spin-dried, baked at 100° C. for 60 seconds to evaporate PGMEA, and then a film thickness was measured. A difference in film thicknesses before and after the PGMEA treatment was obtained.

TABLE 3

| No. | Composition | Film thickness after coating: a (Å) | Film thickness after PGMEA treatment: b (Å) | b/a × 100(%) | Baking temperature | Baking atmosphere |
|---|---|---|---|---|---|---|
| Ex. 1 | UDL-1 | 2411 | 2410 | 100 | 300° C. × 60 sec | Air |
| Ex. 2 | UDL-2 | 2255 | 2254 | 100 | 300° C. × 60 sec | Air |
| Ex. 3 | UDL-3 | 2324 | 2324 | 100 | 300° C. × 60 sec | Air |
| Ex. 4 | UDL-4 | 2282 | 2279 | 100 | 300° C. × 60 sec | Air |
| Ex. 5 | UDL-5 | 2386 | 2385 | 100 | 300° C. × 60 sec | Air |
| Ex. 6 | UDL-6 | 2440 | 2440 | 100 | 300° C. × 60 sec | Air |
| Ex. 7 | UDL-7 | 2463 | 2461 | 100 | 300° C. × 60 sec | Air |
| Ex. 8 | UDL-8 | 2422 | 2421 | 100 | 300° C. × 60 sec | Air |
| Ex. 9 | UDL-9 | 2472 | 2470 | 100 | 300° C. × 60 sec | Air |
| Ex. 10 | UDL-10 | 2298 | 2295 | 100 | 300° C. × 60 sec | Air |
| Ex. 11 | UDL-11 | 2499 | 2497 | 100 | 300° C. × 60 sec | Air |
| Ex. 12 | UDL-12 | 2391 | 2387 | 100 | 300° C. × 60 sec | Air |
| Ex. 13 | UDL-13 | 2303 | 2302 | 100 | 300° C. × 60 sec | Air |
| Ex. 14 | UDL-14 | 2332 | 2330 | 100 | 300° C. × 60 sec | Air |
| Ex. 15 | UDL-15 | 2403 | 2401 | 100 | 300° C. × 60 sec | Air |
| Ex. 16 | UDL-16 | 2309 | 2306 | 100 | 300° C. × 60 sec | Air |
| Ex. 17 | UDL-17 | 2311 | 2310 | 100 | 300° C. × 60 sec | Air |
| Ex. 18 | UDL-18 | 2412 | 2410 | 100 | 300° C. × 60 sec | Air |
| Ex. 19 | UDL-19 | 2257 | 2254 | 100 | 300° C. × 60 sec | Air |
| Ex. 20 | UDL-20 | 2483 | 2479 | 100 | 300° C. × 60 sec | Air |

TABLE 4

| No. | Composition | Film thickness after coating: a (Å) | Film thickness After PGMEA treatment: b (Å) | b/a × 100(%) | Baking temperature | Baking atmosphere |
|---|---|---|---|---|---|---|
| Ex. 21 | UDL-21 | 2450 | 2446 | 100 | 300° C. × 60 sec | Air |
| Ex. 22 | UDL-22 | 2450 | 2449 | 100 | 300° C. × 60 sec | Air |
| Ex. 23 | UDL-23 | 2265 | 2264 | 100 | 300° C. × 60 sec | Air |
| Ex. 24 | UDL-24 | 2364 | 2363 | 100 | 300° C. × 60 sec | Air |
| Ex. 25 | UDL-1 | 2430 | 2429 | 100 | 300° C. × 60 sec | 1% Oxygen concentration |
| Ex. 26 | UDL-1 | 2281 | 2276 | 100 | 350° C. × 60 sec | 0.5% Oxygen concentration |
| Ex. 27 | UDL-1 | 2257 | 2254 | 100 | 300° C. × 300 sec | 0.5% Oxygen concentration |
| Ex. 28 | UDL-1 | 2387 | 2386 | 100 | 350° C. × 300 sec | 0.1% Oxygen concentration |
| Com. Ex. 1 | Com. UDL-1 | 2323 | 2319 | 100 | 300° C. × 60 sec | Air |
| Com. Ex. 2 | Com. UDL-2 | 2292 | 2099 | 92 | 300° C. × 60 sec | Air |
| Com. Ex. 3 | Com. UDL-3 | 1160 | 946 | 82 | 300° C. × 60 sec | Air |

In a resist underlayer film-forming composition of Examples 1 to 28, solvent resistance (resistance against a solvent) could be obtained. Meanwhile, in Comparative Example 2, film components were dissolved by solvent-treatment because of insufficient curing. The film thickness of obtained film was finally insufficient in Comparative Example 3, because the composition of Comparative Example 3 did not contain a resin component. Furthermore, in Example 27 and 28, it took a long time to obtain a solvent resistance due to low oxygen concentration upon forming a film.

Etching Test by a $CF_4/CHF_3$ Gas System

Examples 29 to 53 and Comparative Examples 4 to 6

A resist underlayer film-forming composition (UDL-1 to UDL-25 and Com. UDL-1, 4, 5) was coated on a silicon substrate, then baked at each condition shown in Table 5 to form a resist underlayer film, and then a etching test was done by a $CF_4/CHF_3$ gas system with following conditions.

Etching Conditions:

Chamber pressure: 40.0 Pa

RF power: 1,300 W $CHF_3$ gas flow rate: 30 mL/minute $CF_4$ gas flow rate: 30 mL/minute Ar gas flow rate: 100 mL/minute Time: 60 seconds Film reduction (film loss) was obtained by measuring film thickness before and after etching with an etching instrument TE-8500 (manufactured by Tokyo Electron Ltd.). The results are shown in Table 5.

TABLE 5

| No. | Composition | Film thickness before etching: a' (Å) | Film thickness after etching: b' (Å) | b'/a' × 100(%) | Baking temperature | Baking atmosphere |
|---|---|---|---|---|---|---|
| Ex. 29 | UDL-1 | 2258 | 1401 | 62 | 300° C. × 60 sec | Air |
| Ex. 30 | UDL-2 | 2280 | 1480 | 65 | 300° C. × 60 sec | Air |
| Ex. 31 | UDL-3 | 2264 | 1418 | 63 | 300° C. × 60 sec | Air |
| Ex. 32 | UDL-4 | 2379 | 1566 | 66 | 300° C. × 60 sec | Air |
| Ex. 33 | UDL-5 | 2261 | 1412 | 62 | 300° C. × 60 sec | Air |
| Ex. 34 | UDL-6 | 2356 | 1546 | 66 | 300° C. × 60 sec | Air |
| Ex. 35 | UDL-7 | 2457 | 1653 | 67 | 300° C. × 60 sec | Air |
| Ex. 36 | UDL-8 | 2325 | 1429 | 61 | 300° C. × 60 sec | Air |
| Ex. 37 | UDL-9 | 2280 | 1397 | 61 | 300° C. × 60 sec | Air |
| Ex. 38 | UDL-10 | 2336 | 1484 | 64 | 300° C. × 60 sec | Air |
| Ex. 39 | UDL-11 | 2441 | 1604 | 66 | 300° C. × 60 sec | Air |
| Ex. 40 | UDL-12 | 2409 | 1580 | 66 | 300° C. × 60 sec | Air |
| Ex. 41 | UDL-13 | 2396 | 1527 | 64 | 300° C. × 60 sec | Air |
| Ex. 42 | UDL-14 | 2333 | 1505 | 65 | 300° C. × 60 sec | Air |
| Ex. 43 | UDL-15 | 2410 | 1533 | 64 | 300° C. × 60 sec | Air |
| Ex. 44 | UDL-16 | 2439 | 1609 | 66 | 300° C. × 60 sec | Air |
| Ex. 45 | UDL-17 | 2446 | 1557 | 64 | 300° C. × 60 sec | Air |
| Ex. 46 | UDL-18 | 2459 | 1658 | 67 | 300° C. × 60 sec | Air |
| Ex. 47 | UDL-19 | 2282 | 1406 | 62 | 300° C. × 60 sec | Air |
| Ex. 48 | UDL-20 | 2291 | 1449 | 63 | 300° C. × 60 sec | Air |
| Ex. 49 | UDL-21 | 2396 | 1569 | 65 | 300° C. × 60 sec | Air |
| Ex. 50 | UDL-22 | 2382 | 1542 | 65 | 300° C. × 60 sec | Air |
| Ex. 51 | UDL-23 | 2299 | 1418 | 62 | 300° C. × 60 sec | Air |
| Ex. 52 | UDL-24 | 2322 | 1470 | 63 | 300° C. × 60 sec | Air |
| Ex. 53 | UDL-25 | 2270 | 1377 | 61 | 300° C. × 60 sec | Air |
| Com. Ex. 4 | COM. UDL-1 | 2349 | 1492 | 64 | 300° C. × 60 sec | Air |

TABLE 5-continued

| No. | Composition | Film thickness before etching: a' (Å) | Film thickness after etching: b' (Å) | b'/a' × 100(%) | Baking temperature | Baking atmosphere |
|---|---|---|---|---|---|---|
| Com. Ex. 5 | COM. UDL-4 | 2391 | 1532 | 64 | 300° C. × 60 sec | Air |
| Com. Ex. 6 | COM. UDL-5 | 2250 | 1385 | 62 | 300° C. × 60 sec | Air |

Test of Pattern Etching

Examples 54 to 78 and Comparative Examples 7 to 9

A resist underlayer film-forming composition (UDL-1 to UDL-25 and Comparative examples UDL-1, 4, 5) was coated on a 300-mm Si wafer substrate having a formed SiO$_2$ film having a film thickness of 200 nm, and then baked at each temperature as shown in Tables 5 for 60 seconds to obtain a resist underlayer film having a film thickness of 200 nm. Here, baking of the resist underlayer film was done under an air atmosphere.

On it, a composition for a resist intermediate layer film SOG1 was coated, and then baked at 200° C. for 60 seconds to form a resist intermediate layer film having a film thickness of 35 nm. On it, an SL resist for ArF, a composition for a resist underlayer film, was coated, and then baked at 105° C. for 60 seconds to form a photoresist film having a film thickness of 100 nm. A composition for an immersion top coat (TC-1) was coated on the photoresist film, and then baked at 90° C. for 60 seconds to form a top coat having a film thickness of 50 nm.

As a composition for a resist intermediate layer film (SOG-1), 2% propyleneglycol monomethyl ether solution of following polymer was prepared.

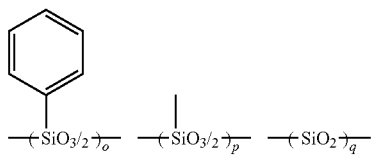

ArF silicon-containing intermediate layer polymer 1

(o = 0.20, p = 0.50, q = 0.30 Mw = 3,400)

A composition for a resist upper layer film (an SL resist for ArF) was prepared by dissolving a resin shown as an ArF monolayer resist polymer 1, an acid generator PAG 1, and a basic compound TMMEA in a solvent containing 0.1% by mass of FC-430 (manufactured by Sumitomo 3M Ltd.) with a ratio as shown in Table 6 followed by filtering the resulting mixture through a 0.1 μm filter made of a fluorinated polymer.

TABLE 6

| No. | Polymer (parts by mass) | Acid generator (parts by mass) | Basic compound (parts by mass) | Solvent (parts by mass) |
|---|---|---|---|---|
| SL resist for ArF | ArF monolayer resist polymer 1 (100) | PAG 1 (6.6) | TMMEA (0.8) | PGMEA (2,500) |

An ArF monolayer resist polymer 1, PAG 1, and TMMEA are shown hereinbelow.

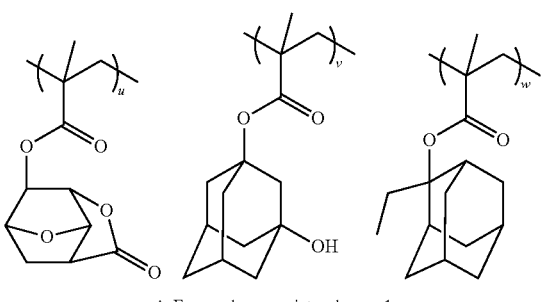

ArF monolayer resist polymer 1

(u = 0.40, v = 0.30, w = 0.30 Mw 7,800)

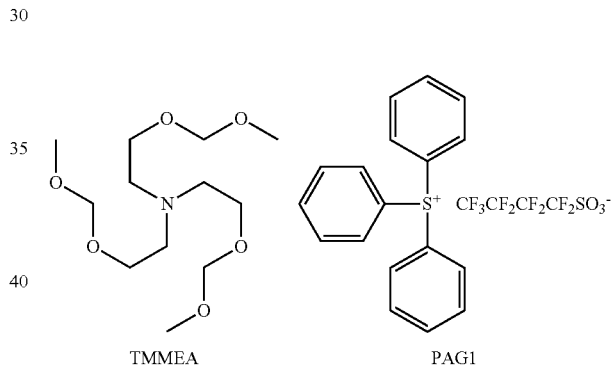

TMMEA                    PAG1

A composition for an immersion top coat (TC-1) was prepared by dissolving a top coat polymer in an organic solvent with a ratio as shown in Table 7 followed by filtering the resulting mixture through a 0.1 μm filter made of a fluorinated polymer.

TABLE 7

| No. | Polymer (parts by mass) | Organic solvent (parts by mass) |
|---|---|---|
| TC-1 | Top coat polymer (100) | Diisoamyl ether (2,700) 2-methyl-1-butanol (270) |

A top coat polymer used is shown hereinbelow.

Top-coat Polymer:

Molecular weight (Mw): 8,800

Dispersivity (Mw/Mn): 1.69

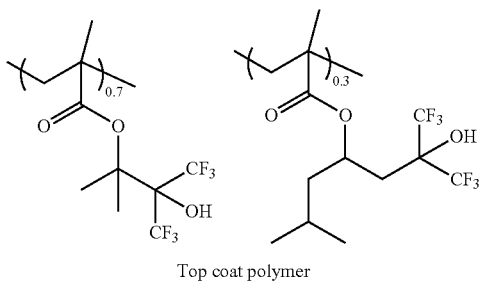

Top coat polymer

Then, it was exposed with an ArF immersion exposure instrument NSR-S610C (NA 1.30, σ 0.98/0.65, 35° dipole s-polarized light illumination, and a 6% half tone phase shift mask, manufactured by Nikon Corp.), baked (PEB) at 100° C. for 60 seconds, and then developed by a 2.38 mass % aqueous tetramethyl ammonium (TMAH) solution for 30 seconds to obtain a 43 nm 1:1 positive line-and-space pattern.

Then, a resist intermediate layer film was dry etched by using a resist pattern as a mask with an etching instrument Telius (manufactured by Tokyo Electron Ltd.), then a resist underlayer film was etched by using a pattern of the obtained resist intermediate layer film as a mask, and further a $SiO_2$ film was etched by using a pattern of the obtained resist underlayer film as a mask. Etching conditions are as following.

Transcription Conditions of a Resist Pattern to a Resist Intermediate Layer Film:
Chamber pressure: 10.0 Pa
RF power: 1,500 W
$CF_4$ gas flow rate: 75 sccm
$O_2$ gas flow rate: 15 sccm
Time: 15 seconds
Transcription Conditions of the Resist Intermediate Layer Film Pattern to a Resist Underlayer Film:
Chamber pressure: 2.0 Pa
RF power: 500 W
Ar gas flow rate: 75 sccm
$O_2$ gas flow rate: 45 sccm
Time: 120 seconds
Transcription Conditions of a Resist Underlayer Film Pattern to a $SiO_2$ Film:
Chamber pressure: 2.0 Pa
RF power: 2,200 W
$C_5F_{12}$ gas flow rate: 20 sccm
$C_2F_6$ gas flow rate: 10 sccm
Ar gas flow rate: 300 sccm
$O_2$: 60 sccm
Time: 90 seconds A pattern cross-section was observed with an electron microscope S-4700 (manufactures by Hitachi, Ltd.), and pattern profile were compared. The results are shown in Tables 8.

TABLE 8

| No. | Composition | Pattern profile after development | Profile after transcription etching of intermediate layer | Profile after transcription etching of underlayer film | Profile after transcription etching of substrate | Pattern twist after transcription etching of substrate |
|---|---|---|---|---|---|---|
| Ex. 54 | UDL-1 | Vertical | Vertical | Vertical | Vertical | No |
| Ex. 55 | UDL-2 | Vertical | Vertical | Vertical | Vertical | No |
| Ex. 56 | UDL-3 | Vertical | Vertical | Vertical | Vertical | No |
| Ex. 57 | UDL-4 | Vertical | Vertical | Vertical | Vertical | No |
| Ex. 58 | UDL-5 | Vertical | Vertical | Vertical | Vertical | No |
| Ex. 59 | UDL-6 | Vertical | Vertical | Vertical | Vertical | No |
| Ex. 60 | UDL-7 | Vertical | Vertical | Vertical | Vertical | No |
| Ex. 61 | UDL-8 | Vertical | Vertical | Vertical | Vertical | No |
| Ex. 62 | UDL-9 | Vertical | Vertical | Vertical | Vertical | No |
| Ex. 63 | UDL-10 | Vertical | Vertical | Vertical | Vertical | No |
| Ex. 64 | UDL-11 | Vertical | Vertical | Vertical | Vertical | No |
| Ex. 65 | UDL-12 | Vertical | Vertical | Vertical | Vertical | No |
| Ex. 66 | UDL-13 | Vertical | Vertical | Vertical | Vertical | No |
| Ex. 67 | UDL-14 | Vertical | Vertical | Vertical | Vertical | No |
| Ex. 68 | UDL-15 | Vertical | Vertical | Vertical | Vertical | No |
| Ex. 69 | UDL-16 | Vertical | Vertical | Vertical | Vertical | No |
| Ex. 70 | UDL-17 | Vertical | Vertical | Vertical | Vertical | No |
| Ex. 71 | UDL-18 | Vertical | Vertical | Vertical | Vertical | No |
| Ex. 72 | UDL-19 | Vertical | Vertical | Vertical | Vertical | No |
| Ex. 73 | UDL-20 | Vertical | Vertical | Vertical | Vertical | No |
| Ex. 74 | UDL-21 | Vertical | Vertical | Vertical | Vertical | No |
| Ex. 75 | UDL-22 | Vertical | Vertical | Vertical | Vertical | No |
| Ex. 76 | UDL-23 | Vertical | Vertical | Vertical | Vertical | No |
| Ex. 77 | UDL-24 | Vertical | Vertical | Vertical | Vertical | No |
| Ex. 78 | UDL-25 | Vertical | Vertical | Vertical | Vertical | No |
| Com. Ex. 7 | Com. UDL-1 | Vertical | Vertical | Vertical | Tapered profile and film reduction | Yes |
| Com. Ex. 8 | Com. UDL-4 | Vertical | Vertical | Vertical | Tapered profile | Yes |
| Com. Ex. 9 | Com. UDL-5 | Vertical | Vertical | Vertical | Tapered profile | Yes |

Further, In Example 78, precipitations of fullerene were generated after the composition (UAL-25) was let stand for at a room temperature for 1 month. Twist was generated in the composition of Comparative Example 7 (Com. UDL-1), because Com. UDL-1 did not contain a fullerene compound. Meanwhile, twist was not generated in all Examples. In Comparative Example 8, a surface-roughness was large because it did not contain compound (B) represented by the general formula (1), though it contained fullerene compound.

Characteristics for Filling Up a Height Difference of a Substrate

Examples 79 to 103

On a Si substrate, UDL-1 to 25 prepared so that a film thickness was 200 nm on a plate substrate was coated on a $SiO_2$ height difference substrate (gap-substrate) having a thickness of 500 nm and having a dense hole pattern with a diameter of 160 nm, baked at 300° C. for 60 seconds (Examples 79 to 103).

Then, the substrate was cut and observed by SEM whether the hole was filled up to the bottom thereof. Hole patterns were filled up to the bottom thereof, and characteristics for filling up the height difference were good in all Examples.

As can be seen in Table 3 and Table 4, a solvent-insoluble film is formed by using a resist underlayer film-forming composition of the present invention and baking the composition at an adequate temperature in an appropriate oxygen atmosphere, and thus a film reduction due to a solvent-treatment is largely suppressed. As can be seen in Table 8, pattern-twist resistance is improved by adding a fullerene compound. As can be seen in Table 5, $CF_4/CHF_3$ gas etching speed is not different between the composition containing a fullerene compound and the composition not containing a fullerene compound, and thus obtained pattern-roughness is good.

It must be stated here that the present invention is not limited to the above-mentioned embodiments. The embodiments shown above are mere examples so that any embodiment composed of substantially the same technical concept as disclosed in the claims of the present invention and expressing a similar effect is included in the technical scope of the present invention.

What is claimed is:

1. A resist underlayer film-forming composition comprising, at least:
   a resin (A) obtained by condensing a compound represented by the following general formula (1) with a compound represented by the following general formula (2) by the aid of an acid catalyst;
   a compound (B) represented by the general formula (1);
   a fullerene compound (C); and
   an organic solvent,

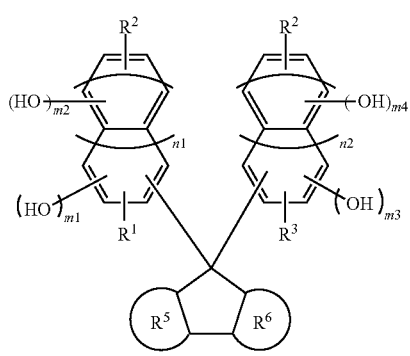

(1)

wherein,
$R^1$, $R^2$, $R^3$, and $R^4$ are the same or different from one another, and are each a hydrogen atom, or a hydrocarbon group having 6 to 22 carbon atoms, which hydrocarbon group may contain an oxygen atom or a hydroxyl group;
$R^5$ and $R^6$ are each a benzene ring or a naphthalene ring;
$1 \leq m1+m2 \leq 2$;
$1 \leq m3+m4 \leq 2$; and
n1 and n2 are each 0 or 1, $$R^7\text{—CHO} \quad (2)$$

wherein,
$R^7$ is a hydrogen atom, a saturated or unsaturated linear, branched, or cyclic hydrocarbon group having 1 to 20 carbon atoms, or an aromatic hydrocarbon group having 6 to 20 carbon atoms, which hydrocarbon groups may contain an ether group, a nitro group, a hydroxyl group, or a chloro group.

2. The resist underlayer film-forming composition according to claim 1, wherein the compound represented by the general formula (1) is a compound where n1=n2=1.

3. The resist underlayer film-forming composition according to claim 2, wherein the compound represented by the general formula (1) is a compound represented by the following general formula (3),

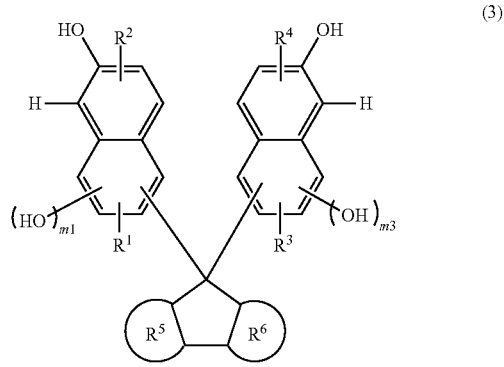

(3)

wherein,
$R^1$, $R^2$, $R^3$, $R^4$, $R^5$, and $R^6$ are the same meanings as before; and
m1 and m3 are each 0 or 1.

4. The resist underlayer film-forming composition according to claim 3, wherein the compound represented by the general formula (2) is at least one kind of aldehyde compound selected from among formaldehyde, benzaldehyde, 1-naphthylaldehyde, and 2-naphthylaldehyde.

5. A process for forming a resist underlayer film to be used in a lithography, comprising at least the steps of:
   spin coating the resist underlayer film-forming composition according to claim 4 onto a substrate; and
   subsequently baking the substrate in an atmosphere of oxidizing gas at an oxidizing gas concentration between 0.1% or more and 21% or less.

6. The process for forming a resist underlayer film according to claim 5, wherein the oxidizing gas is oxygen.

7. A process for forming a resist underlayer film to be used in a lithography, comprising at least the steps of:
   spin coating the resist underlayer film-forming composition according to claim 3 onto a substrate; and
   subsequently baking the substrate in an atmosphere of oxidizing gas at an oxidizing gas concentration between 0.1% or more and 21% or less.

8. The process for forming a resist underlayer film according to claim 7, wherein the oxidizing gas is oxygen.

9. The resist underlayer film-forming composition according to claim 2, wherein the compound represented by the general formula (2) is at least one kind of aldehyde compound selected from among formaldehyde, benzaldehyde, 1-naphthylaldehyde, and 2-naphthylaldehyde.

10. A process for forming a resist underlayer film to be used in a lithography, comprising at least the steps of:
spin coating the resist underlayer film-forming composition according to claim 9 onto a substrate; and
subsequently baking the substrate in an atmosphere of oxidizing gas at an oxidizing gas concentration between 0.1% or more and 21% or less.

11. The process for forming a resist underlayer film according to claim 10, wherein the oxidizing gas is oxygen.

12. A process for forming a resist underlayer film to be used in a lithography, comprising at least the steps of:
spin coating the resist underlayer film-forming composition according to claim 2 onto a substrate; and
subsequently baking the substrate in an atmosphere of oxidizing gas at an oxidizing gas concentration between 0.1% or more and 21% or less.

13. The process for forming a resist underlayer film according to claim 12, wherein the oxidizing gas is oxygen.

14. The resist underlayer film-forming composition according to claim 1, wherein the compound represented by the general formula (1) is a compound represented by the following general formula (3),

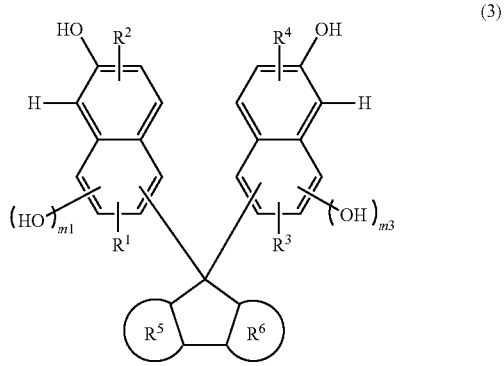

wherein,
$R^1, R^2, R^3, R^4, R^5$, and $R^6$ are the same meanings as before; and
m1 and m3 are each 0 or 1.

15. The resist underlayer film-forming composition according to claim 14, wherein the compound represented by the general formula (2) is at least one kind of aldehyde compound selected from among formaldehyde, benzaldehyde, 1-naphthylaldehyde, and 2-naphthylaldehyde.

16. A process for forming a resist underlayer film to be used in a lithography, comprising at least the steps of:
spin coating the resist underlayer film-forming composition according to claim 15 onto a substrate; and
subsequently baking the substrate in an atmosphere of oxidizing gas at an oxidizing gas concentration between 0.1% or more and 21% or less.

17. The process for forming a resist underlayer film according to claim 16, wherein the oxidizing gas is oxygen.

18. A process for forming a resist underlayer film to be used in a lithography, comprising at least the steps of:
spin coating the resist underlayer film-forming composition according to claim 14 onto a substrate; and
subsequently baking the substrate in an atmosphere of oxidizing gas at an oxidizing gas concentration between 0.1% or more and 21% or less.

19. The process for forming a resist underlayer film according to claim 18, wherein the oxidizing gas is oxygen.

20. The resist underlayer film-forming composition according to claim 1, wherein the compound represented by the general formula (2) is at least one kind of aldehyde compound selected from among formaldehyde, benzaldehyde, 1-naphthylaldehyde, and 2-naphthylaldehyde.

21. A process for forming a resist underlayer film to be used in a lithography, comprising at least the steps of:
spin coating the resist underlayer film-forming composition according to claim 20 onto a substrate; and
subsequently baking the substrate in an atmosphere of oxidizing gas at an oxidizing gas concentration between 0.1% or more and 21% or less.

22. The process for forming a resist underlayer film according to claim 21, wherein the oxidizing gas is oxygen.

23. A process for forming a resist underlayer film to be used in a lithography, comprising at least the steps of:
spin coating the resist underlayer film-forming composition according to claim 1 onto a substrate; and
subsequently baking the substrate in an atmosphere of oxidizing gas at an oxidizing gas concentration between 0.1% or more and 21% or less.

24. The process for forming a resist underlayer film according to claim 23, wherein the oxidizing gas is oxygen.

25. A patterning process for forming a pattern on a substrate by a lithography, comprising at least the steps of:
forming a resist underlayer film on the substrate by the process for forming a resist underlayer film according to claim 24;
forming a resist intermediate layer film on the resist underlayer film by using a resist intermediate layer film composition containing a silicon atom;
forming a resist upper layer film on the resist intermediate layer film by using a resist upper layer film composition composed of a photoresist composition;
conducting exposure of a pattern circuit region of the resist upper layer film, subsequently developing the upper layer film by a developer to form a resist pattern in the resist upper layer film, and etching the resist intermediate film by using the thus obtained resist pattern as an etching mask, to form a resist intermediate film pattern;
etching the resist underlayer film by using the thus obtained resist intermediate film pattern as an etching mask, to form a resist underlayer film pattern; and
etching the substrate by using the thus obtained resist underlayer film pattern as an etching mask, to form a pattern on the substrate.

26. A patterning process for forming a pattern on a substrate by a lithography, comprising at least the steps of:
forming a resist underlayer film on the substrate by the process for forming a resist underlayer film according to claim 24;
forming an inorganic hard mask intermediate film selected from among a silicon oxide film, a silicon nitride film, and a silicon oxynitride film on the resist underlayer film;
forming a resist upper layer film on the inorganic hard mask intermediate film by using a resist upper layer film composition composed of a photoresist composition;

conducting exposure of a pattern circuit region of the resist upper layer film, subsequently developing the upper layer film by a developer to form a resist pattern in the resist upper layer film, and etching the inorganic hard mask intermediate film by using the thus obtained resist pattern as an etching mask, to form an inorganic hard mask intermediate film pattern;

etching the resist underlayer film by using the thus obtained inorganic hard mask intermediate film pattern as an etching mask, to form a resist underlayer film pattern; and etching the substrate by using the thus obtained resist underlayer film pattern as an etching mask, to form a pattern on the substrate.

27. The patterning process according to claim 26, wherein the inorganic hard mask intermediate film is farmed by a CVD method or an ALD method.

28. A patterning process for forming a pattern on a substrate by a lithography, comprising at least the steps of:
forming a resist underlayer film on the substrate by the process for forming a resist underlayer film according to claim 24;
forming an inorganic hard mask intermediate film selected from among a silicon oxide film, a silicon nitride film, and a silicon oxynitride film on the resist underlayer film;
forming an organic antireflective film on the inorganic hard mask intermediate film;
forming a resist upper layer film on the organic antireflective film by using a resist upper layer film composition composed of a photoresist composition;
conducting exposure of a pattern circuit region of the resist upper layer film, subsequently developing the upper layer film by a developer to form a resist pattern in the resist upper layer film, and etching the organic antireflective film and the inorganic hard mask intermediate film by using the thus obtained resist pattern as an etching mask, to form an inorganic hard mask intermediate film pattern;
etching the resist underlayer film by using the thus obtained inorganic hard mask intermediate film pattern as an etching mask, to form a resist underlayer film pattern; and
etching the substrate by using the thus obtained resist underlayer film pattern as an etching mask, to form a pattern on the substrate.

29. The patterning process according to claim 28, wherein the inorganic hard mask intermediate film is formed by a CVD method or an ALD method.

30. A patterning process for forming a pattern on a substrate by a lithography, comprising at least the steps of:
forming a resist underlayer film on the substrate by the process for forming a resist underlayer film according to claim 23;
forming a resist intermediate layer film on the resist underlayer film by using a resist intermediate layer film composition containing a silicon atom;
forming a resist upper layer film on the resist intermediate layer film by using a resist upper layer film composition composed of a photoresist composition;
conducting exposure of a pattern circuit region of the resist upper layer film, subsequently developing the upper layer film by a developer to form a resist pattern in the resist upper layer film, and etching the resist intermediate film by using the thus obtained resist pattern as an etching mask, to form a resist intermediate film pattern;
etching the resist underlayer film by using the thus obtained resist intermediate film pattern as an etching mask, to form a resist underlayer film pattern; and
etching the substrate by using the thus obtained resist underlayer film pattern as an etching mask, to form a pattern on the substrate.

31. A patterning process for forming a pattern on a substrate by a lithography, comprising at least the steps of:
forming a resist underlayer film on the substrate by the process for forming a resist underlayer film according to claim 23;
forming an inorganic hard mask intermediate film selected from among a silicon oxide film, a silicon nitride film, and a silicon oxynitride film on the resist underlayer film;
forming a resist upper layer film on the inorganic hard mask intermediate film by using a resist upper layer film composition composed of a photoresist composition;
conducting exposure of a pattern circuit region of the resist upper layer film, subsequently developing the upper layer film by a developer to form a resist pattern in the resist upper layer film, and etching the inorganic hard mask intermediate film by using the thus obtained resist pattern as an etching mask, to form an inorganic hard mask intermediate film pattern;
etching the resist underlayer film by using the thus obtained inorganic hard mask intermediate film pattern as an etching mask, to form a resist underlayer film pattern; and
etching the substrate by using the thus obtained resist underlayer film pattern as an etching mask, to form a pattern on the substrate.

32. The patterning process according to claim 31, wherein the inorganic hard mask intermediate film is formed by a CVD method or an ALD method.

33. A patterning process for forming a pattern on a substrate by a lithography, comprising at least the steps of:
forming a resist underlayer film on the substrate by the process for forming a resist underlayer film according to claim 23;
forming an inorganic hard mask intermediate film selected from among a silicon oxide film, a silicon nitride film, and a silicon oxynitride film on the resist underlayer film;
forming an organic antireflective film on the inorganic hard mask intermediate film;
forming a resist upper layer film on the organic antireflective film by using a resist upper layer film composition composed of a photoresist composition;
conducting exposure of a pattern circuit region of the resist upper layer film, subsequently developing the upper layer film by a developer to form a resist pattern in the resist upper layer film, and etching the organic antireflective film and the inorganic hard mask intermediate film by using the thus obtained resist pattern as an etching mask, to form an inorganic hard mask intermediate film pattern;
etching the resist underlayer film by using the thus obtained inorganic hard mask intermediate film pattern as an etching mask, to form a resist underlayer film pattern; and
etching the substrate by using the thus obtained resist underlayer film pattern as an etching mask, to form a pattern on the substrate.

34. The patterning process according to claim 33, wherein the inorganic hard mask intermediate film is formed by a CVD method or an ALD method.

* * * * *